US008610106B2

(12) United States Patent
Shioda et al.

(10) Patent No.: US 8,610,106 B2
(45) Date of Patent: Dec. 17, 2013

(54) SEMICONDUCTOR LIGHT EMITTING DEVICE

(75) Inventors: Tomonari Shioda, Kanagawa-ken (JP); Toshiki Hikosaka, Kanagawa-ken (JP); Yoshiyuki Harada, Tokyo (JP); Naoharu Sugiyama, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 160 days.

(21) Appl. No.: 13/213,821

(22) Filed: Aug. 19, 2011

(65) Prior Publication Data

US 2012/0138890 A1    Jun. 7, 2012

(30) Foreign Application Priority Data

Dec. 2, 2010  (JP) .................................. 2010-269169

(51) Int. Cl.
*H01L 33/06* (2010.01)
(52) U.S. Cl.
USPC ..................................... 257/13; 257/E33.012
(58) Field of Classification Search
USPC .................. 257/13, 103, 99, 77, 43, E33.012
See application file for complete search history.

(56) References Cited

U.S. PATENT DOCUMENTS

2004/0256611 A1* 12/2004 Kim et al. .......................... 257/13
2009/0272992 A1* 11/2009 Tsutsumi et al. ................ 257/94
2011/0215291 A1* 9/2011 Ito et al. ............................ 257/13
2012/0032214 A1* 2/2012 Ito et al. ............................ 257/98
2012/0217524 A1* 8/2012 Sato et al. ......................... 257/98

FOREIGN PATENT DOCUMENTS

| JP | 2003-234545 A | 8/2003 |
| JP | 2005-12216 | 1/2005 |
| JP | 2007-214257 | 8/2007 |
| JP | 2008-235606 | 10/2008 |

OTHER PUBLICATIONS

U.S. Appl. No. 13/213,373, filed Aug. 19, 2011, Shioda, et al.
Office Action issued Apr. 1, 2013 in Japanese Patent Application No. 2010-269169 with English language translation.

* cited by examiner

*Primary Examiner* — Whitney T Moore
(74) *Attorney, Agent, or Firm* — Oblon, Spivak, McClelland, Maier & Neustadt, L.L.P.

(57) ABSTRACT

According to one embodiment, a semiconductor light emitting device includes an n-type semiconductor layer, a p-type semiconductor layer and a light emitting part. The light emitting part is provided between the n-type semiconductor layer and the p-type semiconductor layer and includes a first light emitting layer. The first light emitting layer includes a first barrier layer, a first well layer, a first n-side intermediate layer and a first p-side intermediate layer. The barrier layer, the well layer, the n-side layer and the p-side intermediate layer include a nitride semiconductor. An In composition ratio in the n-side layer decreases along a first direction from the n-type layer toward the p-type layer. An In composition ratio in the p-side layer decreases along the first direction. An average change rate of the In ratio in the p-side layer is lower than an average change rate of the In ratio in the n-side layer.

19 Claims, 9 Drawing Sheets

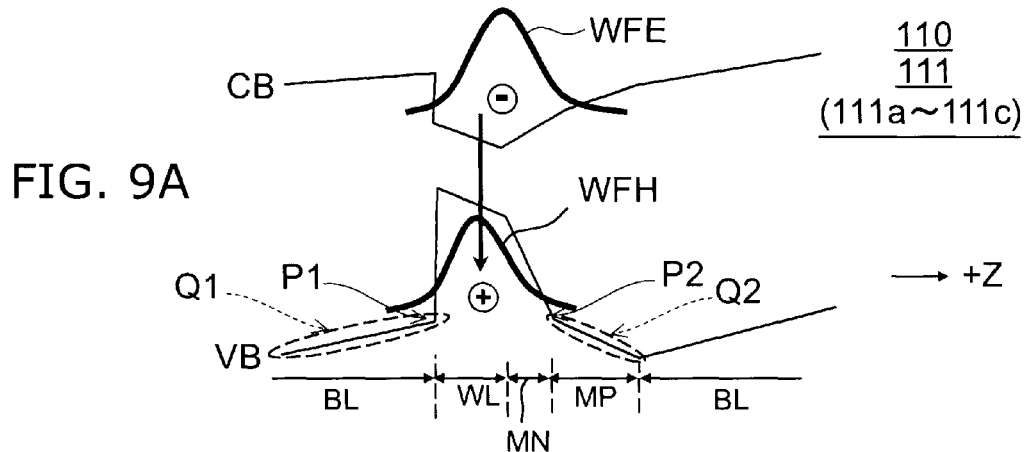
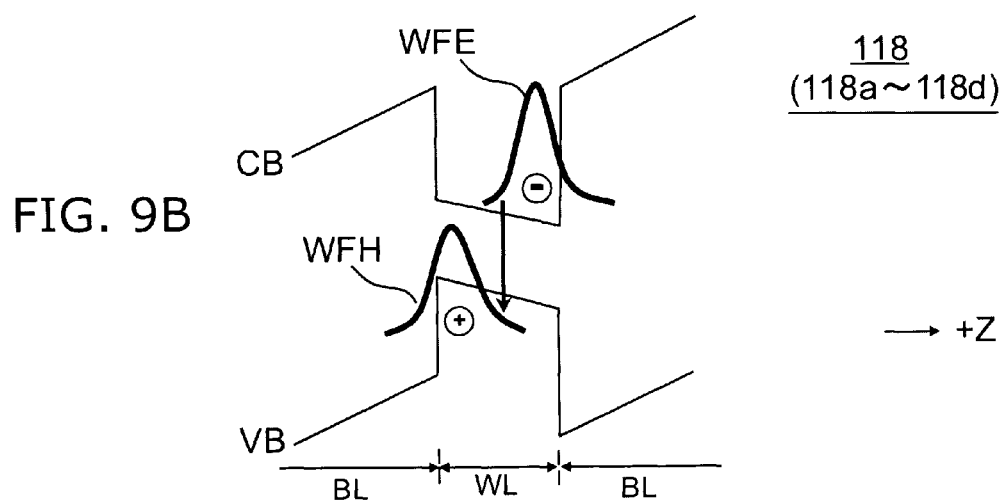
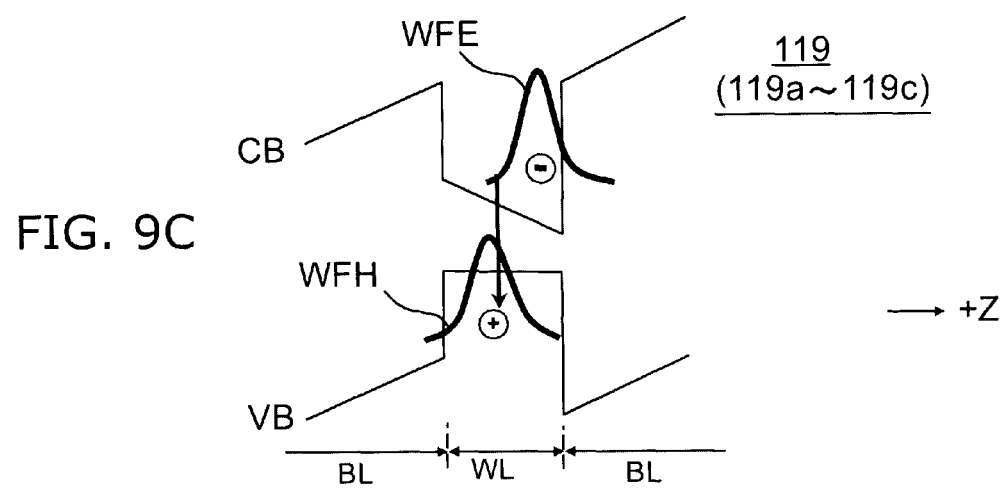

SEMICONDUCTOR LIGHT EMITTING DEVICE

CROSS-REFERENCE TO RELATED APPLICATIONS

This application is based upon and claims the benefit of priority from the prior Japanese Patent Application No. 2010-269169, filed on Dec. 2, 2010; the entire contents of which are incorporated herein by reference.

FIELD

Embodiments described herein relate generally to a semiconductor light emitting device.

BACKGROUND

A light emitting diode (LED), which is a semiconductor light emitting device using a nitride semiconductor, is used in display devices, illumination, and the like. A laser diode (LD) is used in light sources for reading and writing with respect to a high-density memory disc and the like.

In such a semiconductor light emitting device, there is a need to achieve an increase in the efficiency.

BRIEF DESCRIPTION OF THE DRAWINGS

FIGS. 9A to 9C are schematic views showing the simulation results of the characteristics of the semiconductor light emitting devices;

DETAILED DESCRIPTION

Figure 1A:
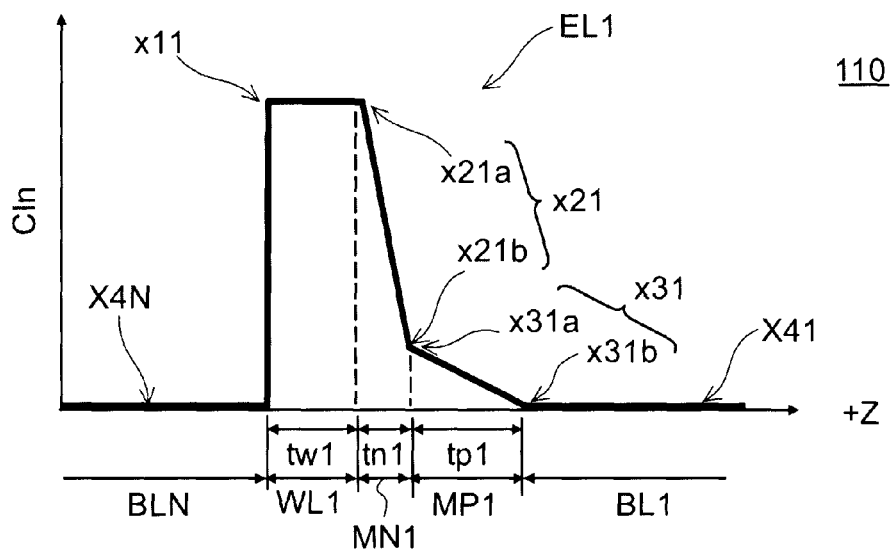
FIGS. 1A and 1B are schematic views showing a part of semiconductor light emitting devices according to an embodiment.

In general, according to one embodiment, a semiconductor light emitting device includes an n-type semiconductor layer, a p-type semiconductor layer and a light emitting part. The light emitting part is provided between the n-type semiconductor layer and the p-type semiconductor layer and includes a first light emitting layer. The first light emitting layer includes a first barrier layer, a first well layer, a first n-side intermediate layer and a first p-side intermediate layer. The first barrier layer includes a nitride semiconductor. The first well layer is provided between the n-type semiconductor layer and the first barrier layer and includes a nitride semiconductor. The first n-side intermediate layer is provided between the first well layer and the first barrier layer and includes a nitride semiconductor. The first p-side intermediate layer is provided between the first n-side intermediate layer and the first barrier layer and includes a nitride semiconductor. An In composition ratio among group III elements in the first n-side intermediate layer decreases along a first direction from the n-type semiconductor layer toward the p-type semiconductor layer. An In composition ratio among group III elements in the first p-side intermediate layer decreases along the first direction. An average change rate along the first direction of the In composition ratio in the first p-side intermediate layer is lower than an average change rate along the first direction of the In composition ratio in the first n-side intermediate layer.

Various embodiments will be described hereinafter with reference to the accompanying drawings.

The drawings are schematic or conceptual; and the relationships between the thicknesses and widths of portions, the proportions of sizes among portions, etc., are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

Embodiments

Figure 2:
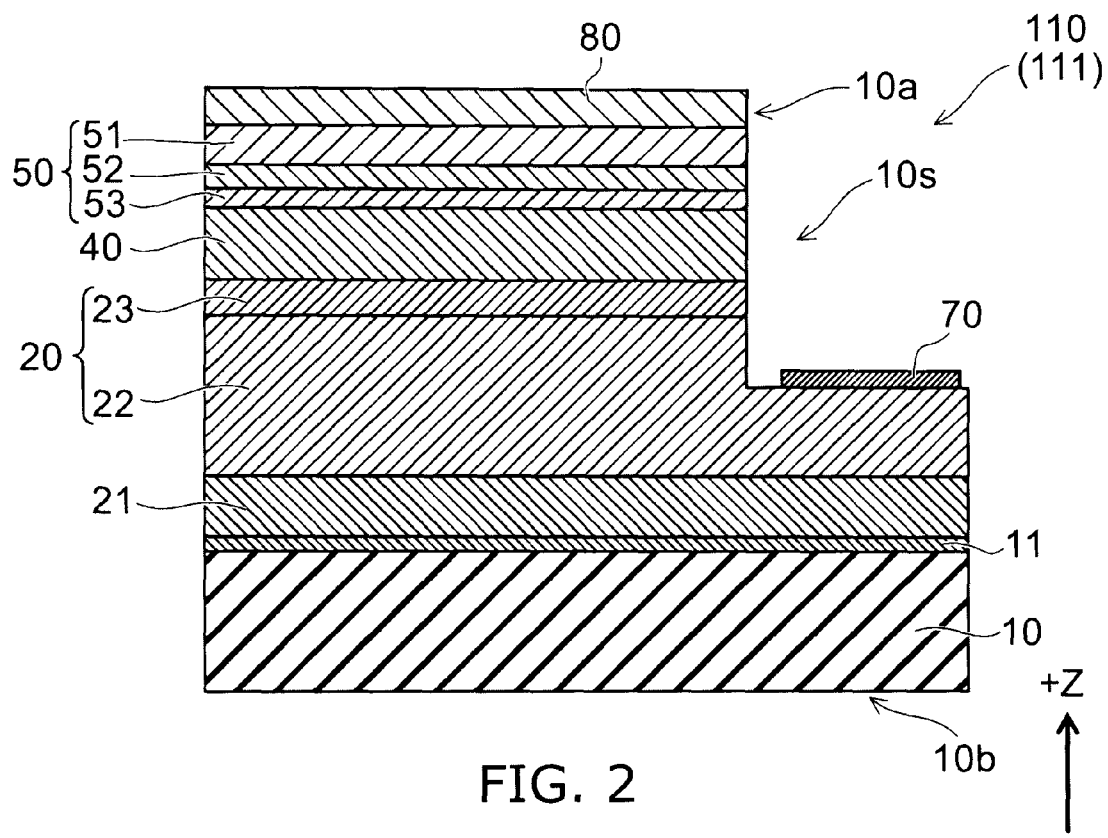
FIG. 2 is a schematic cross-sectional view showing the semiconductor light emitting device according to the embodiment.

FIG. 2 is a schematic cross-sectional view illustrating a configuration of a semiconductor light emitting device according to an embodiment.

First, the overview of the configuration of the semiconductor light emitting device according to the embodiment will be explained with reference to FIG. 2.

As illustrated in FIG. 2, a semiconductor light emitting device 110 according to the embodiment includes an n-type semiconductor layer 20, a p-type semiconductor layer 50, and a light emitting part 40. The light emitting part 40 is provided between the n-type semiconductor layer 20 and the p-type semiconductor layer 50. As described later, the light emitting part 40 includes a light emitting layer (e.g., a first light emitting layer).

For example, the n-type semiconductor layer 20 can include an n-side contact layer 22. The n-side contact layer 22 is provided between a foundation layer 21 and the light emitting part 40, for example. For the foundation layer 21, a GaN layer is used, for example. For the n-side contact layer 22, a GaN layer containing an n-type impurity is used. As the n-type impurity, Si (silicon) is used, for example.

In this specific example, the n-type semiconductor layer further includes a multilayer stacked body 23. The multilayer stacked body 23 is provided between the n-side contact layer 22 and the light emitting part 40. The multilayer stacked body 23 is provided as required, or may be omitted. The multilayer stacked body 23 will be described later.

The p-type semiconductor layer 50 can include, for example, a first p-type layer 51, a second p-type layer 52, and a third p-type layer 53. The second p-type layer 52 is provided between the first p-type layer 51 and the light emitting part 40.

The third p-type layer 53 is provided between the second p-type layer 52 and the light emitting part 40. For the third p-type layer 53, a p-type AlGaN layer is used, for example. The third p-type layer 53 can function as an electron overflow blocking layer (current overflow blocking layer). For the second p-type layer 52, an Mg doped p-type GaN layer is used. For the first p-type layer 51, a p-type GaN layer doped with Mg at a high concentration can be used. The first p-type layer 51 functions as a contact layer. As the p-type impurity, Mg (magnesium) is used, for example.

In the semiconductor light emitting device 110, there is provided a stacked structure body 10s including the n-type semiconductor layer 20, the light emitting part 40, and the p-type semiconductor layer 50. In this example, a part on the side of a first major surface 10a of the stacked structure body 10s is selectively removed. Thus, a part of the n-type semiconductor layer 20 is exposed to the side of the first major surface 10a. An n-side electrode 70 is provided in this exposed portion. The n-side electrode 70 is in contact with the n-type semiconductor layer 20. The embodiment is not limited thereto, but the n-side electrode 70 may be provided on the side of a second main surface 10b of the n-type semiconductor layer 20. As the n-side electrode 70, a composite film of titanium-platinum-gold (Ti/Pt/Au) is used, for example.

A p-side electrode 80 is in contact with the p-type semiconductor layer 50. For the p-side electrode 80, indium tin oxide (ITO) or the like is used. For the p-side electrode 80, a composite film of nickel-gold (nickel/Au) or the like can be used.

The semiconductor light emitting device 110 further includes a substrate 10 and a buffer layer 11. The substrate 10 and the buffer layer 11 are provided as required, or may be omitted.

For the substrate 10, sapphire is used, for example. For example, a sapphire (0001) is used for the substrate 10. Furthermore, a SiC substrate, a Si substrate, or a GaN substrate may be used for the substrate 10. Moreover, in the sapphire substrate, a substrate with a plane orientation other than (0001) may be used. The buffer layer 11 is formed on the substrate 10. For the buffer layer 11, a GaN layer is used, for example. The n-type semiconductor layer 20, the light emitting part 40, and the p-type semiconductor layer 50 are sequentially formed on the buffer layer 11. The substrate 10 may be removed after forming the above-described semiconductor layers on the buffer layer 11.

Here, the direction from the n-type semiconductor layer toward the p-type semiconductor layer 50 is the +Z direction.

Figure 3:
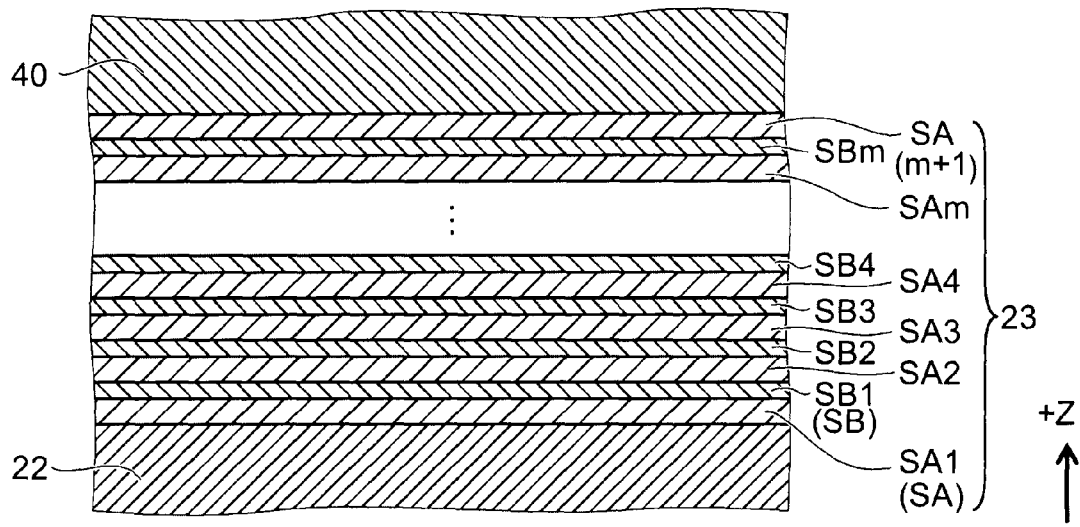
FIG. 3 is a schematic cross-sectional view showing a part of the semiconductor light emitting device according to the embodiment.

FIG. 3 is a schematic cross-sectional view illustrating the configuration of a part of the semiconductor light emitting device according to the embodiment.

FIG. 3 illustrates an example of the configuration of the multilayer stacked body 23.

As illustrated in FIG. 3, the multilayer stacked body 23 includes a plurality of thick film layers SA and a plurality of thin film layers SB, the thick film layer SA and thin film layer SB being alternately stacked along the +Z direction. The thin film layer SB has a thickness equal to the thickness of the thick film layer SA or a thickness less than the thickness of the thick film layer SA. The thin film layer SB has a composition different from the composition of the thick film layer SA.

For example, the thin film layers SB include a first thin film layer SB1 to an m-th thin film layer SBm, where "m" is an integer of two or more. The thick film layers SA include the first thick film layer SA1 to the m-th thick film layer SAm. The thick film layers SA may further include the (m+1)th thick film layer SA(m+1).

In this specific example, "m" which is the number of thin film layers SB is 20, and the number of thick film layers SA is m+1, i.e., 21. However, the embodiment is not limited thereto, but "m" is any integer of two or more.

The multilayer stacked body 23 can have a superstructure, for example.

The thickness of the thick film layer SA is set to 3 nanometers (nm) or less, for example. More specifically, the thickness of the thick film layer SA is between 1 nm and 3 nm, for example. The thickness of the thin film layer SB is less than 1.5 nm, for example, and is equal to or less than the thickness of the thick film layer SA. This enables the multilayer stacked body 23 to have the superlattice structure.

The multilayer stacked body 23 can include a nitride semiconductor.

Specifically, the thick film layer SA includes GaN, for example. The thin film layer SB includes InGaN. For the thick film layer SA, the GaN layer which does not substantially contain In is used, for example. For the thin film layer SB, an $In_{0.08}Ga_{0.92}N$ layer is used, for example. The In concentration in the thin film layer SB is not limited thereto, but is arbitrary as long as an excellent crystal quality is obtained.

For example, the bandgap energy of the thin film layer SB is lower than the bandgap energy of the thick film layers SA. Here, in the specification, the bandgap energy of each layer refers to the bandgap energy in a bulk state unaffected by a strain or a quantum effect, the bandgap energy being determined by the composition which each layer has.

Figure 4:
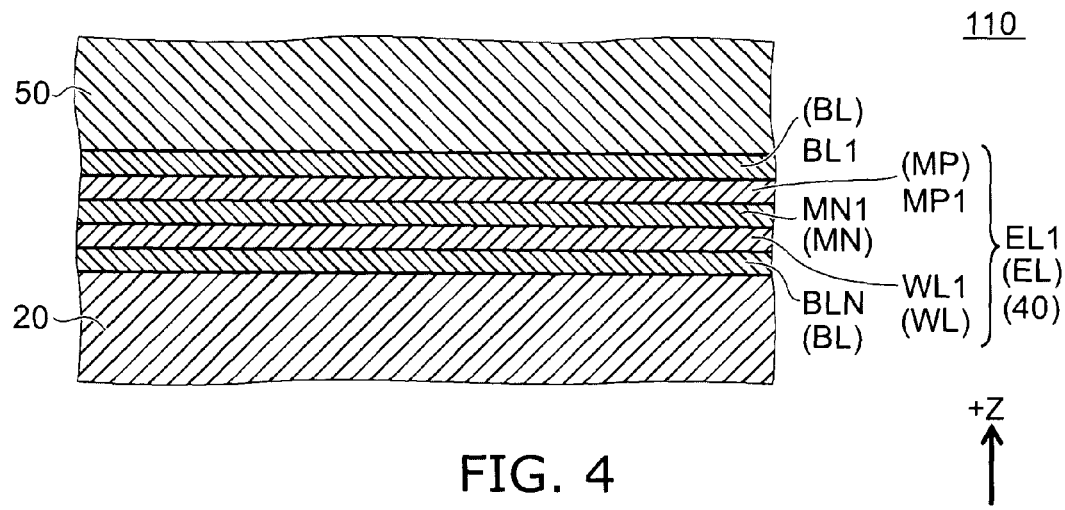
FIG. 4 is a schematic cross-sectional view showing a part of the semiconductor light emitting device according to the embodiment.

FIG. 4 is a schematic cross-sectional view illustrating the configuration of a part of the semiconductor light emitting device according to the embodiment.

FIG. 4 illustrates an example of the configuration of the light emitting part 40.

As illustrated in FIG. 4, in the semiconductor light emitting device 110, the light emitting part 40 includes one light emitting layer EL (the first light emitting layer EL1). The first light emitting layer EL1 includes: a first barrier layer BL1 including a nitride semiconductor; a first well layer WL1 provided between the n-type semiconductor layer 20 and the first barrier layer BL1 and including a nitride semiconductor; a first n-side intermediate layer MN1 provided between the first well layer WL1 and the first barrier layer BL1 and including a nitride semiconductor; and a first p-side intermediate layer MP1 provided between the first n-side intermediate-layer MN1 and the first barrier layer BL1 and including a nitride semiconductor.

The n-side barrier layer BLN is provided between the first well layer WL1 and the n-type semiconductor layer 20. The n-side barrier layer BLN can be included in the light emitting layer EL (the first light emitting layer EL1). That is, the first light emitting layer EL1 can further include the n-side barrier layer BLN, which is provided between the n-type semiconductor layer 20 and the first well layer WL1 and the n-side barrier layer BLN is in contact with the first well layer WL1.

In this example, the number of well layers WL is one. Thus, the light emitting part 40 can have a single quantum well (SQW) structure.

Figure 5:
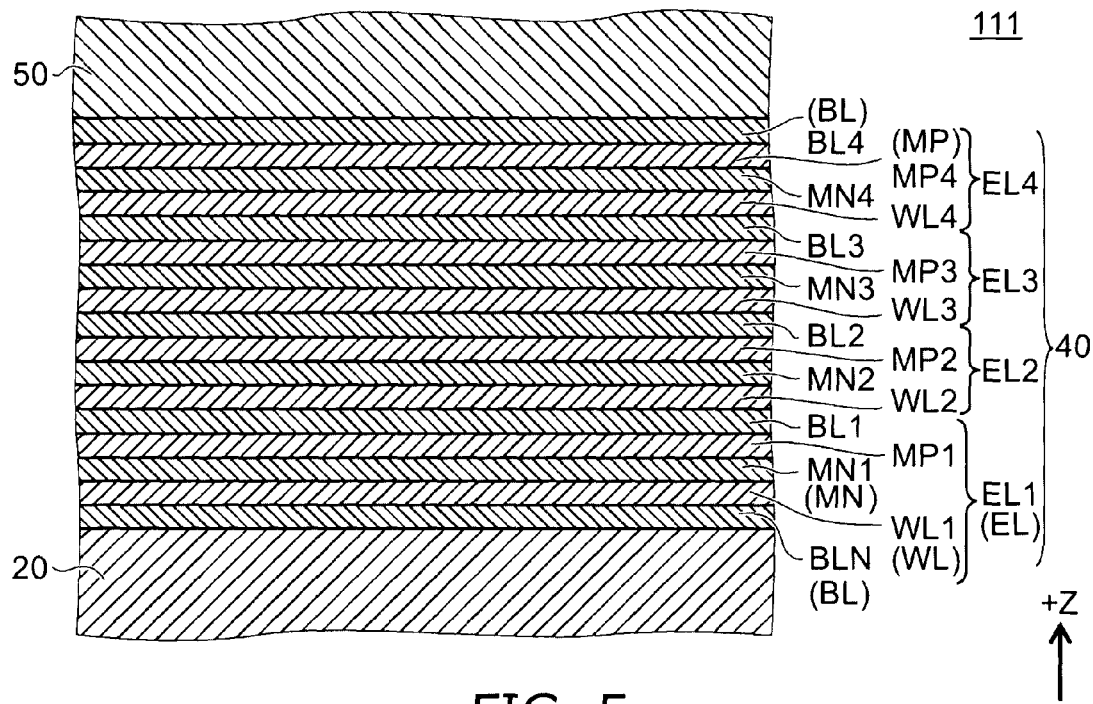
FIG. 5 is a schematic cross-sectional view showing a part of the semiconductor light emitting device according to the embodiment.

FIG. 5 is a schematic cross-sectional view illustrating the configuration of a part of the semiconductor light emitting device according to the embodiment.

FIG. 5 illustrates an example of the configuration of the light emitting part 40 in another semiconductor light emitting device 111 according to the embodiment.

Since the configurations of the portions other than the light emitting part 40 in the semiconductor light emitting device 111 are the same as the configurations of those of the semiconductor light emitting device 110 illustrated in FIG. 2, the description thereof is omitted.

As illustrated in FIG. 5, the light emitting part 40 includes a plurality of light emitting layers EL. The light emitting layers EL include, for example, a first light emitting layer EL1, a second light emitting layer EL2, a third light emitting layer EL3, a fourth light emitting layer EL4, and the like. That is, the light emitting layers EL each include the first light emitting layer EL1 to the n-th light emitting layer ELn, where "n" is an integer of two or more.

The relationship along the Z-axis direction between the i-th light emitting layer ELi and the (i+1)th light emitting layer EL(i+1) is arbitrary, where "i" is an integer of one or more. The (i+1)th light emitting layer EL(i+1) may be provided between the i-th light emitting layer ELi and the n-type semiconductor layer 20 or may be provided between the i-th light emitting layer ELi and the p-type semiconductor layer 50. A j-th light emitting layer ELj may be provided between the i-th light emitting layer ELi and the (i+1)th light emitting layer EL(i+1). Here, "j" differs from i and also differs from (i+1), and is an integer of one or more.

In this example, the number of light emitting layers ELs is four. However, the embodiment is not limited thereto. The number of light emitting layers EL is 2 or more, and is arbitrary.

Each of the light emitting layers EL includes the barrier layer BL, the well layer WL, the n-side intermediate layer MN, and the p-side intermediate layer MP. The barrier layer BL, the well layer WL, the n-side intermediate layer MN, and the p-side intermediate layer MP include a nitride semiconductor.

In the i-th light emitting layer ELi, the i-th well layer WLi is provided between the n-type semiconductor layer 20 and the i-th barrier layer BLi.

The bandgap energy of the i-th well layer WLi is lower than the bandgap energy of the i-th barrier layer BLi. For example, the bandgap energy of the first well layer WL1 is lower than the bandgap energy of the first barrier layer BL1. The bandgap energy of the i-th well layer WLi is lower than the bandgap energy of the n-side barrier layer BLN.

The i-th n-side intermediate layer MNi is provided between the i-th well layer WLi and the i-th barrier layer BLi. The i-th p-side intermediate layer MPi is provided between the i-th n-side intermediate layer MNi and the i-th barrier layer BLi.

However, at least two of the light emitting layers EL may have the above-described configuration. For example, in the light emitting layers EL excluding two of them, the n-side intermediate layer MN or the p-side intermediate layer MP may not be provided.

That is, the first light emitting layer EL1 includes: the first barrier layer BL1 including a nitride semiconductor; the first well layer WL1 provided between the n-type semiconductor layer 20 and the first barrier layer BL1 and including a nitride semiconductor; the first n-side intermediate layer MN1 provided between the first well layer WL1 and the first barrier layer BL1 and including a nitride semiconductor; and the first p-side intermediate layer MP1 provided between the first n-side intermediate-layer MN1 and the first barrier layer BL1 and including a nitride semiconductor.

In addition, the light emitting part 40 further includes a second stacked light emitting layer EL2 stacked with the first light emitting layer EL along the +Z direction.

Here, in the specification, when the "stacked layer" is referred to, it includes cases where layers are stacked in the state where other element is sandwiched therebetween, other than cases where layers are stacked in contact with each other.

The second light emitting layer EL2 includes: a second barrier layer BL2 including a nitride semiconductor, a second well layer WL2 provided between the n-type semiconductor layer 20 and the second barrier layer BL2 and including a nitride semiconductor, a second n-side intermediate layer MN2 provided between the second well layer WL2 and the second barrier layer BL2 and including a nitride semiconductor, and a second p-side intermediate layer MP2 provided between second n-side intermediate layer MN2 and second barrier layer BL2 and including a nitride semiconductor.

In the example illustrated in FIG. 5, the first light emitting layer EL1 is closest to the n-type semiconductor layer 20 among the four light emitting layers EL, and the second light emitting layer EL2 is second closest to the n-type semiconductor layer 20 among the four light emitting layers EL. However, the embodiment is not limited thereto. Among the light emitting layers EL, the position of the first light emitting layer EL1 is arbitrary. Among the light emitting layers EL, the position of the second light emitting layer EL is arbitrary.

In the following, the embodiment will be described assuming that the second light emitting layer EL2 is provided between the first light emitting layer EL1 and the p-type semiconductor layer 50, when two or more light emitting layers EL are provided.

The n-side barrier layer BLN is provided between the n-type semiconductor layer 20 and the well layer WL which is closest to the n-type semiconductor layer 20 among the light emitting layers EL. The n-side barrier layer BLN can be included in the light emitting layer EL.

As described above, the light emitting part 40 of the semiconductor light emitting device 111 has a multiple quantum well (MQW) structure.

Hereinafter, an example of the configuration of the light emitting part 40 will be explained.

Figure 1B:
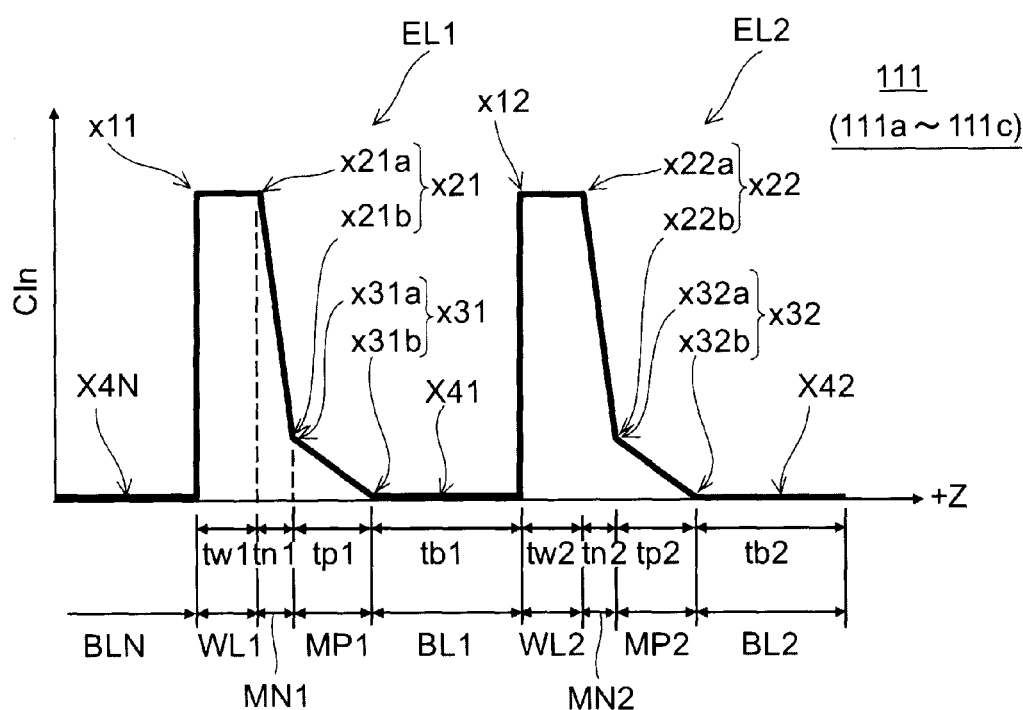

FIGS. 1A and 1B are schematic views illustrating the configuration of a part of semiconductor light emitting devices according to the embodiment, respectively.

FIG. 1A illustrates the configuration of the light emitting part 40 of the semiconductor light emitting device 110. FIG. 1B illustrates two light emitting layers EL in the light emitting part 40 of the semiconductor light emitting device 111.

These views illustrate the In composition ratio among group III elements in the respective semiconductor layers. The horizontal axis represents the position in the +Z direction. The vertical axis represents an In composition ratio CIn. The In composition ratio CIn is the composition ratio of In among the group III elements.

As illustrated in FIG. 1A, in the semiconductor light emitting device 110, the well layer WL (the first well layer WL1) includes $In_{x11}Ga_{1-x11}N$ ($0.18 \le x11 < 1$), where x11 is the In composition ratio among the group III elements in the first well layer WL1.

The n-side intermediate layer MN (the first n-side intermediate layer MN1) includes $In_{x21}Ga_{1-x21}N$ ($0 < x21 \le x11$), where x21 is the In composition ratio among the group III elements in the first n-side intermediate layer MN1.

The P-side intermediate layer MP (the first p-side intermediate layer MP1) includes $In_{x31}Ga_{1-x31}N$ ($0 < x31 \le x21$), where x31 is the In composition ratio among the group III elements in the first p-side intermediate layer MP1.

The barrier layer BL (the first barrier layer BL1) includes $In_{x41}Ga_{1-x41}N$ ($0 \le x41 \le x31$), where x41 is the In composition ratio among the group III elements in the first barrier layer BL1. For example, the first barrier layer BL1 is a GaN layer.

The In composition ratio CIn(x21) among the group III elements in the first n-side intermediate layer MN1 decreases along the +Z direction. The In composition ratio CIn(x31) among the group III elements in the first p-side intermediate layer MP1 decreases along the +Z direction.

The average change rate along the +Z direction of the In composition ratio CIn(x31) in the first p-side intermediate layer MP1 is lower than the average change rate along the +Z direction of the In composition ratio CIn(x21) in the first n-side intermediate layer MN1.

For example, the In composition ratio CIn in a portion of the first n-side intermediate layer MN1 in contact with the first well layer WL1 is x21a. The In composition ratio CIn in a portion of the first n-side intermediate layer MN1 in contact with the first p-side intermediate layer MP1 is x21b. The In composition ratio CIn in the first n-side intermediate layer MN1 decreases from x21a to x21b along the +Z direction.

The average change rate along the +Z direction of the In composition ratio CIn(x21) in the first n-side intermediate layer MN1 is a difference between x21a and x21b divided by the thickness (a first n-side intermediate layer thickness tn1) along the +Z direction of the first n-side intermediate layer MN1, for example. That is, the average change rate of the In composition ratio CIn(x21) in the first n-side intermediate layer MN1 is (x21a−x21b)/tn1.

Similarly, the In composition ratio CIn in a portion of the first p-side intermediate layer MP1 in contact with the first n-side intermediate layer MN1 is x31a. The In composition ratio CIn in a portion of the first p-side intermediate layer MP1 in contact with the first barrier layer BL1 is x31b. The In composition ratio CIn in the first p-side intermediate layer MP1 decrease from x31a to x31b along the +Z direction.

The average change rate along the +Z direction of the In composition ratio CIn(x31) in the first p-side intermediate layer MP1 is a difference between x31a and x31b divided by the thickness (a first p-side intermediate layer thickness tp1) along the +Z direction of the first p-side intermediate layer MP1, for example. That is, the average change rate of the In composition ratio CIn(x31) in the first p-side intermediate layer MP1 is (x31a−x31b)/tp1.

(x31a−x31b)/tp1 is smaller than (x21a−x21b)/tn1.

As described above, in the embodiment, two intermediate layers are provided, and the average change rate of the In composition ratio in the n-side intermediate layer MN is higher than the average change rate of the In composition ratio CIn in the p-side intermediate layer MP. That is, in the n-side intermediate layer MN, the In composition ratio CIn steeply decreases. In the p-side intermediate layer MP, the In composition ratio CIn slowly decreases.

In this specific example, the In composition ratio x21a in the portion of the first n-side intermediate layer MN1 in contact with the first well layer WL1 is the same as the In composition ratio x11 among the group III elements contained in first well layer WL1. Then, the In composition ratio x31a in the first n-side intermediate layer MN1 in contact with the portion of the first p-side intermediate layer MP1 is the same as the In composition ratio x21b in the portion of the first n-side intermediate layer MN1 in contact with the first p-side intermediate layer MP1. As described above, in this specific example, the In composition ratio CIn continuously varies.

The n-side barrier layer BLN includes $In_{x4N}Ga_{1-x4N}N$ ($0 \leq x4N \leq x31$), where x4N is the In composition ratio among the group III elements in the n-side barrier layer BLN. For example, the n-side barrier layer BLN is a GaN layer.

Thus, a highly efficient semiconductor light emitting device can be provided. The characteristics of the semiconductor light emitting device will be described later.

Such a configuration is applied also in a plurality of light emitting layers EL.

That is, as illustrated in FIG. 1B, the configuration of the first light emitting layer EL1 of the semiconductor light emitting device 111 is the same as that of the semiconductor light emitting device 110. The vertical-to-horizontal ratio in FIG. 1B has been changed from that in FIG. 1A.

In the second light emitting layer EL2 of the semiconductor light emitting device 111, the second well layer WL2 includes $In_{x12}Ga_{1-x12}N$ ($0.18 \leq x12 < 1$), where x12 is the In composition ratio among the group III elements in the second well layer WL2.

The second n-side intermediate layer MN2 includes $In_{x22}Ga_{1-x22}N$ ($0 < x22 \leq x12$), where x22 is the In composition ratio among the group III elements in the second n-side intermediate layer MN2.

The second p-side intermediate layer MP2 includes $In_{x32}Ga_{1-x32}N$ ($0 < x32 \leq x22$), where x32 is the In composition ratio among the group III elements in the second p-side intermediate layer MP2.

The second barrier layer BL2 includes $In_{x42}Ga_{1-x42}N$ ($0 \leq x42 \leq x32$), where x42 is the In composition ratio among the group III elements in the second barrier layer BL2. For example, the second barrier layer BL2 is a GaN layer.

The In composition ratio CIn(x22) among the group III elements in the second n-side intermediate layer MN2 decreases along the +Z direction. The In composition ratio CIn(x32) among the group III elements in the second p-side intermediate layer MP2 decreases along the +Z direction.

The average change rate along the +Z direction of the In composition ratio CIn(x32) in the second p-side intermediate layer MP2 is lower than the average change rate along the +Z direction of the In composition ratio CIn(x22) in the second n-side intermediate layer MN2.

For example, the In composition ratio CIn in a portion of the second n-side intermediate layer MN2 in contact with the second well layer WL2 is x22a. The In composition ratio CIn in a portion of the second n-side intermediate layer MN2 in contact with the second p-side intermediate layer MP2 is x22b. The In composition ratio CIn in the second n-side intermediate layer MN2 decreases from x22a to x22b along the +Z direction.

The average change rate along the +Z direction of the In composition ratio CIn(x22) in the second n-side intermediate layer MN2 is a difference between x22a and x22b divided by the thickness (a second n-side intermediate layer thickness tn2) along the +Z direction of the second n-side intermediate layer MN2, for example. That is, the average change rate of the In composition ratio CIn(x22) in the second n-side intermediate layer MN2 is (x22a−x22b)/tn2.

Similarly, the In composition ratio CIn in a portion of the second p-side intermediate layer MP2 in contact with the second n-side intermediate layer MN2 is x32a. The In composition ratio CIn in a portion of the second p-side intermediate layer MP2 in contact with the second barrier layer BL2 is x32b. The In composition ratio CIn in the second p-side intermediate layer MP2 decreases from x32a to x32b along the +Z direction.

The average change rate along the +Z direction of the In composition ratio CIn(x32) in the second p-side intermediate layer MP2 is a difference between x32a and x32b divided by the thickness (a second p-side intermediate layer thickness tp2) along the +Z direction of the second p-side intermediate layer MP2, for example. That is, the average change rates of the In composition ratio CIn(x32) in the second p-side intermediate layer MP2 is (x32a−x32b)/tp2.

(x32a−x32b)/tp2 is smaller than (x22a−x22b)/tn2.

The thickness of the first well layer WL1 is a first well layer thickness tw1. The thickness of the second well layer WL2 is a second well layer thickness tw2. The thickness of the first barrier layer BL1 is a first barrier layer thickness tb1. The thickness of second barrier layer BL2 is a second barrier layer thickness tb2.

For example, the i-th well layer WLi includes $In_{x1i}Ga_{1-x1i}N$ (0.18≤x1i<1), where x1i is the In composition ratio among the group III elements in the i-th well layer WL.

The i-th n-side intermediate layer MNi includes $In_{x2i}Ga_{1-x2i}N$ (0<x2i≤x1i) where x2i is the In composition ratio among the group III elements in the i-th n-side intermediate layer MNi.

The i-th p-side intermediate layer MPi includes $In_{x3i}Ga_{1-x3i}N$ (0<x3i≤x2i), where x3i is the In composition ratio among the group III elements in the i-th p-side intermediate layer MPi.

The i-th barrier layer BLi includes $In_{x4i}Ga_{1-x4i}N$ (0≤x4i≤x3i), where x4i is the In composition ratio among the group III elements in the i-th barrier layer BLi.

The In composition ratio CIn(x2i) among the group III elements in the i-th n-side intermediate layer MNi decreases along the +Z direction. The In composition ratio CIn(x3i) among the group III elements in the i-th p-side intermediate layer MPi decreases along the +Z direction.

The average change rate along the +Z direction of the In composition ratio CIn(x3i) in the i-th p-side intermediate layer MPi is lower than the average change rate along the +Z direction of the In composition ratio CIn(x2i) in the i-th n-side intermediate layer MNi.

For example, the In composition ratio CIn in a portion of the i-th n-side intermediate layer MNi in contact with the i-th well layer WLi is x2ia. The In composition ratio CIn in a portion of the i-th n-side intermediate layer MNi in contact with the i-th p-side intermediate layer MPi is x2ib. The In composition ratio CIn in the i-th n-side intermediate layer MNi decreases from x2ia to x2ib along the +Z direction. Then, the thickness along the +Z direction of the i-th n-side intermediate layer MNi is denoted by an i-th n-side intermediate layer thickness tni.

The In composition ratio CIn in a portion of the i-th p-side intermediate layer MPi in contact with the i-th n-side intermediate layer MNi is x3ia. The In composition ratio CIn in a portion of the i-th p-side intermediate layer MPi in contact with the i-th barrier layer BLi is x3ib. The In composition ratio CIn in the i-th p-side intermediate layer MPi decreases from x3a to x3b along the +Z direction. The thickness along the +Z direction of the i-th p-side intermediate layer MPi is denoted by an i-th p-side intermediate layer thickness tpi.

Then, (x3ia−x3ib)/tpi is lower than (x2ia−x2ib)/tni.

Thus, a highly efficient semiconductor light emitting device can be provided.

Hereinafter, the semiconductor light emitting devices 110 and 111 according to the embodiment will be described as compared with semiconductor light emitting devices of reference examples.

Figure 6A:
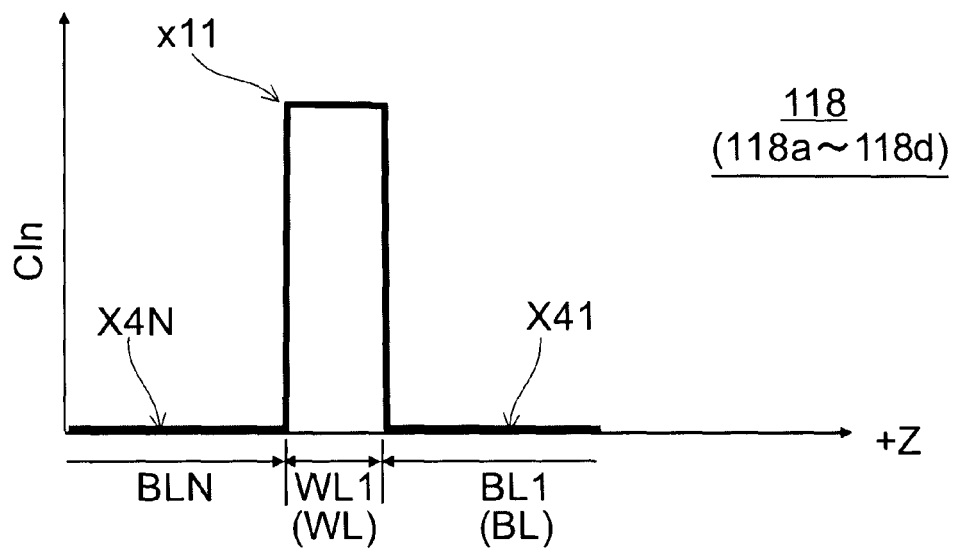
FIGS. 6A and 6B are schematic views showing a part of the semiconductor light emitting devices of reference examples.
Figure 6B:
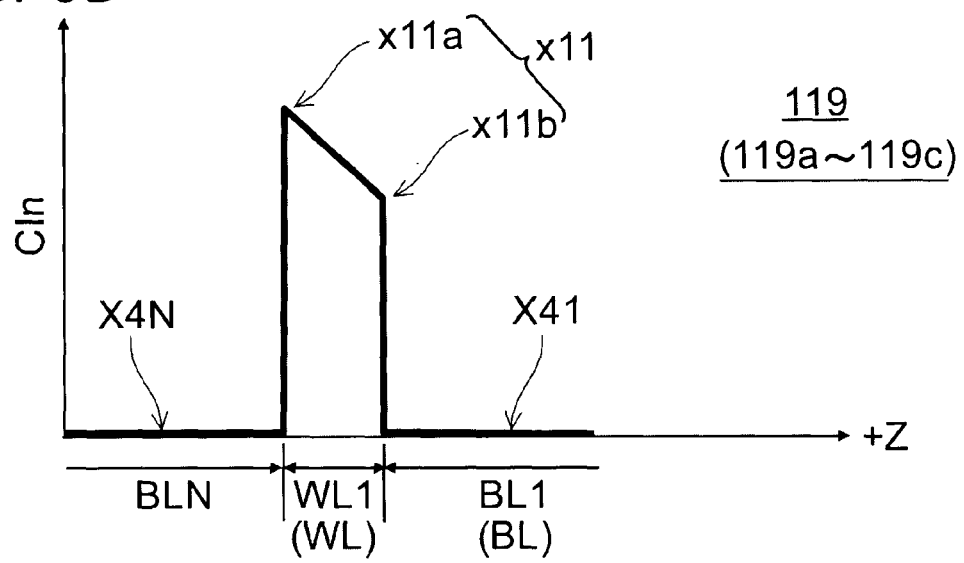

FIGS. 6A and 6B are schematic views illustrating the configurations of a part of the semiconductor light emitting devices of the reference examples.

As illustrated in FIG. 6A, in a semiconductor light emitting device 118 of a first reference example, the n-side intermediate layer and the p-side intermediate layer are not provided. In this view, only one well layer WL (the first well layer WL1) is illustrated, but when the MQW structure is also applied in the semiconductor light emitting device 118, the n-side intermediate layer and the p-side intermediate layer are not provided.

As illustrated in FIG. 6B, in a semiconductor light emitting device 119 of a second reference example, the n-side intermediate layer and the p-side intermediate layer are not provided, and the In composition ratio CIn in the well layer WL (the first well layer WL1, in this example) varies. That is, the In composition ratio CIn in a portion of the n-side of first well layer WL1 in contact with the barrier layer BL (n-side barrier layer BLN) is x11a. The In composition ratio CIn in a portion of the p-side of first well layer WL1 in contact with the barrier layer BL (first barrier layer BL1) is x11b. In the second reference example, there are a case where x11b is lower than x11a and a case where x11b is higher than x11a. In this view, only one well layer WL is illustrated, but in the semiconductor light emitting device 119, also when the MQW structure is applied, the n-side intermediate layer and the p-side intermediate layer are not provided and the In composition ratio CIn in the well layer WL varies.

Here, suppose that the semiconductor light emitting device 118 of the first reference example includes eight well layers WL. Then, in the semiconductor light emitting device 118, the light emission intensity of four kinds of semiconductor light emitting devices having different light emission wavelengths was simulated by varying the thickness of the well layer WL.

In this simulation, the following conditions were used. The barrier layers BL (the n-side barrier layer BLN, and the first barrier layer BL1 to the eighth barrier layer BL8) are GaN layers not containing In. The thickness of a total of the well layers WL and the barrier layers BL was set to 14.5 nm. The well layers WL (the first well layer WL1 to the eighth well layer WL8) are $In_{0.24}Ga_{0.76}N$ layers. That is, the In composition ratio CIn is 0.24 and kept constant. The thickness of the well layer WL was set to 2.0 nm, 2.25 nm, 2.5 nm, and 3 nm, respectively. These semiconductor light emitting devices with the well layer WL having different thicknesses are semiconductor light emitting devices 118a-118d, respectively.

Similarly, the semiconductor light emitting device 119 of the second reference example includes eight well layers WL. Then, in the semiconductor light emitting device 119, the light emission intensity of three kinds of semiconductor light emitting devices having different light emission wavelengths was simulated by varying the In composition ratio.

In this simulation, the following conditions were used. The barrier layers BL (the n-side barrier layer BLN, and the first barrier layer BL1 to the eighth barrier layer BL8) are GaN layers not containing In. The thickness of the barrier layer BL was set to 12.5 nm. The In composition ratio x11a on the side of the n-type semiconductor layer 20 of the well layers WL (the first well layer WL1 to the eighth well layer WL8) was set to 0.24. Then, the In composition ratio x11b on the side of the p-type semiconductor layer 50 of the well layer WL was set to 0.26 or 0.28. Then, the In composition ratio was assumed to linearly increase from x11a to x11b. These semiconductor light emitting devices having different composition ratios x11b on the side of the p-type semiconductor layer 50 of the well layers WL are semiconductor light emitting devices 119a (x11b=0.26) and 119c (x11b=0.28), respectively. The In composition ratio x11a on the side of the n-type semiconductor layer 20 was set to 0.26, the In composition ratio x11b on the side of the p-type semiconductor layer 50 of the well layer WL was set to 0.24, and the In composition ratio was assumed to linearly decrease from x11a to x11b. This is the semiconductor light emitting device 119b.

On the other hand, assume that the semiconductor light emitting device 111 according to the embodiment includes eight well layers WL. Then, in the semiconductor light emitting device 111, the light emission intensity of three kinds of semiconductor light emitting device having different light emission wavelengths was simulated by varying the thickness of the n-side intermediate layer MN (the first n-side intermediate layer MN1 to the eighth n-side intermediate layer MN8).

In this simulation, the following conditions were used. The barrier layers BL (the n-side barrier layer BLN, and the first barrier layer BL1 to the eighth barrier layer BL8) are GaN layers not containing In. The thickness of a total of the well layers WL, the n-side intermediate layers MN, the p-side intermediate layers MP, and the barrier layers BL was set to 14.5 nm. The well layers WL (first well layer WL1 to the eighth well layer WL8) are $In_{0.24}Ga_{0.76}N$ layers. That is, the In composition ratio CIn is 0.24 and kept constant. The thickness of the well layer WL was set to 2 nm.

The In composition ratio CIn in the p-side intermediate layer MP (the first p-side intermediate layer MP1 to the eighth p-side intermediate layer MP8) decreases from x3a to x3b. The variation of the In composition ratio CIn was assumed to be linear with respect to the +Z direction. X3ia was set to 0.02. X3ib was set to zero. The thickness (tp1-tp8) of the p-side intermediate layer MP was set to 3 nm.

The In composition ratio CIn in the n-side intermediate layer MN (the first n-side intermediate layer MN1 to the eighth n-side intermediate layer MN8) decreases from x2a to x2b. The variation of the In composition ratio CIn was assumed to be linear with respect to the +Z direction. X2ia was set to 0.24. X2ib was set to 0.02. The thicknesses (tn1-tn8) of the n-side intermediate layer MN were set to 1.0 nm, 2.0 nm, or 3.0 nm, respectively. These three kinds of semiconductor light emitting devices with the n-side intermediate layer MN having different thicknesses (tn1-tn8) are semiconductor light emitting devices 111a-111c, respectively.

In any one of the semiconductor light emitting devices 111a-111c, the average change rate along the +Z direction of the In composition ratio CIn in the p-side intermediate layer MP is lower than the average change rate along the +Z direction of the In composition ratio in the n-side intermediate layer MN.

Figure 7A:
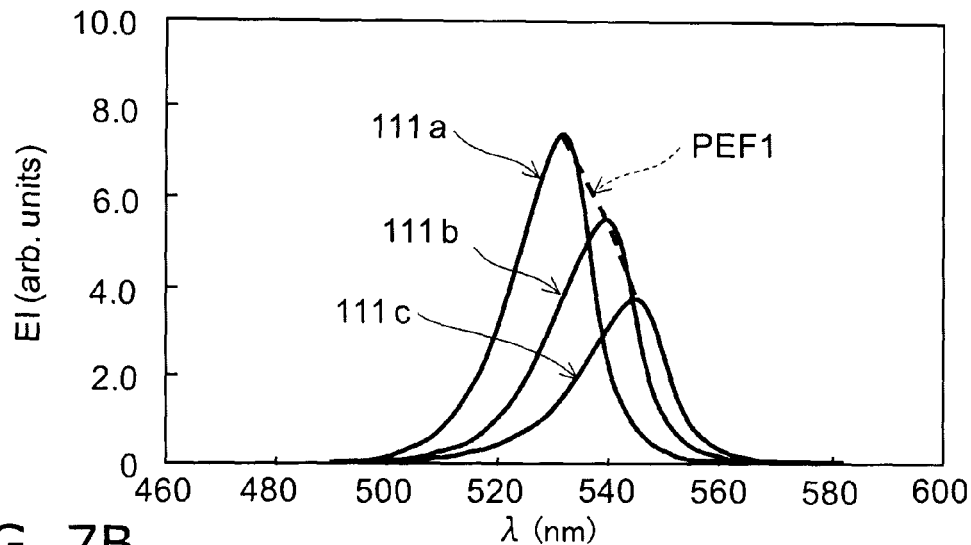
FIGS. 7A to 7C are graphs showing the simulation results of the characteristics of the semiconductor light emitting devices.
Figure 7B:
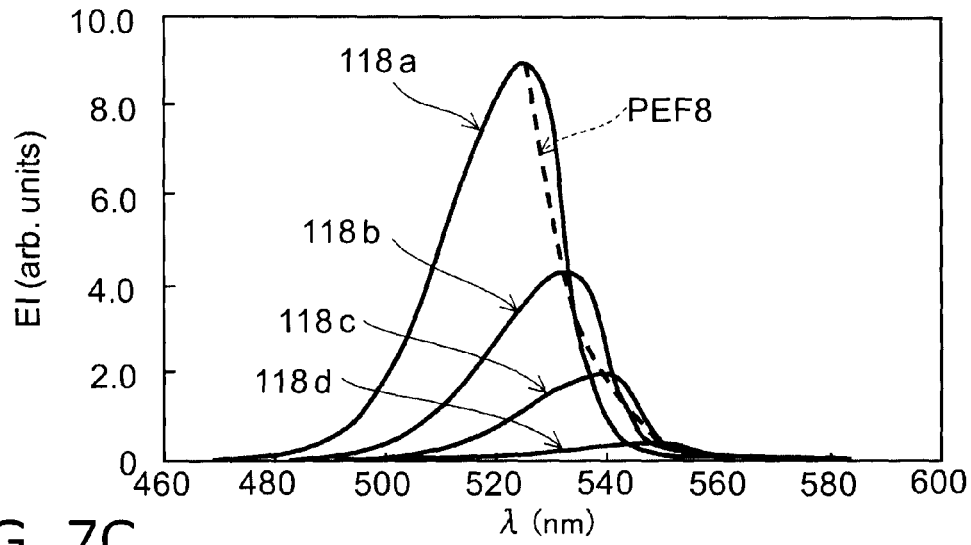
Figure 7C:
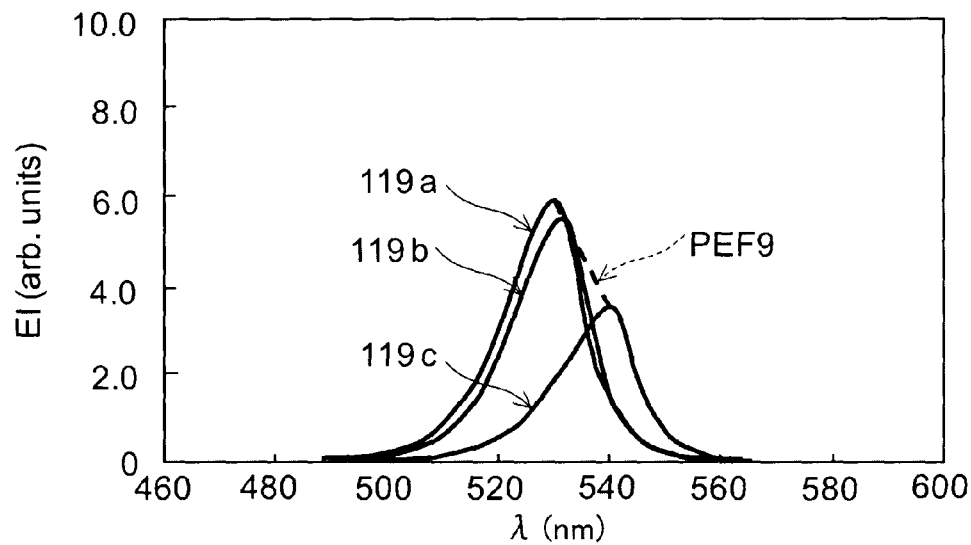

FIGS. 7A to 7C are graphs illustrating the simulation results of the characteristics of the semiconductor light emitting devices.

These views illustrate the simulation results of the emission characteristics of the above-described semiconductor light emitting devices. FIG. 7A corresponds to the semiconductor light emitting devices 111a-111c. FIG. 7B corresponds to the semiconductor light emitting devices 118a-118d. FIG. 7C corresponds to the semiconductor light emitting devices 119a-119c. The horizontal axis represents wavelength λ (nm). The vertical axis represents a light emission intensity EI (arbitrary scale).

As illustrated in FIG. 7B, the peak wavelength of the semiconductor light emitting device 118a of the first reference example is approximately 525 nm. The light emission intensity EI at this time is relatively high. In the first reference example, as with the semiconductor light emitting devices 118b-118d, the light emission intensity EI steeply decreases as the peak wavelength increases. Here, in the semiconductor light emitting devices 118a-118d, if the points of the light emission intensity EI at the respective peak wavelengths are connected, a peak light emission intensity curve PEF8 is obtained.

As illustrated in FIG. 7C, also in the semiconductor light emitting devices 119a-119c of the second reference example, the light emission intensity EI decreases as the peak wavelength increases. In the semiconductor light emitting devices 119a-119d, if the points of the light emission intensity EI at the respective peak wavelengths are connected, a peak light emission intensity curve PEF9 is obtained.

As illustrated in FIG. 7A, also in the semiconductor light emitting devices 111a-111c according to the embodiment, the light emission intensity EI decreases as the peak wavelength increases. However, the extent of the decrease in the light emission intensity is small. In the semiconductor light emitting devices 111a-111c, if the points of the light emission intensity EI at the respective peak wavelengths are connected, a peak light emission intensity curve PEF1 is obtained.

Figure 8:
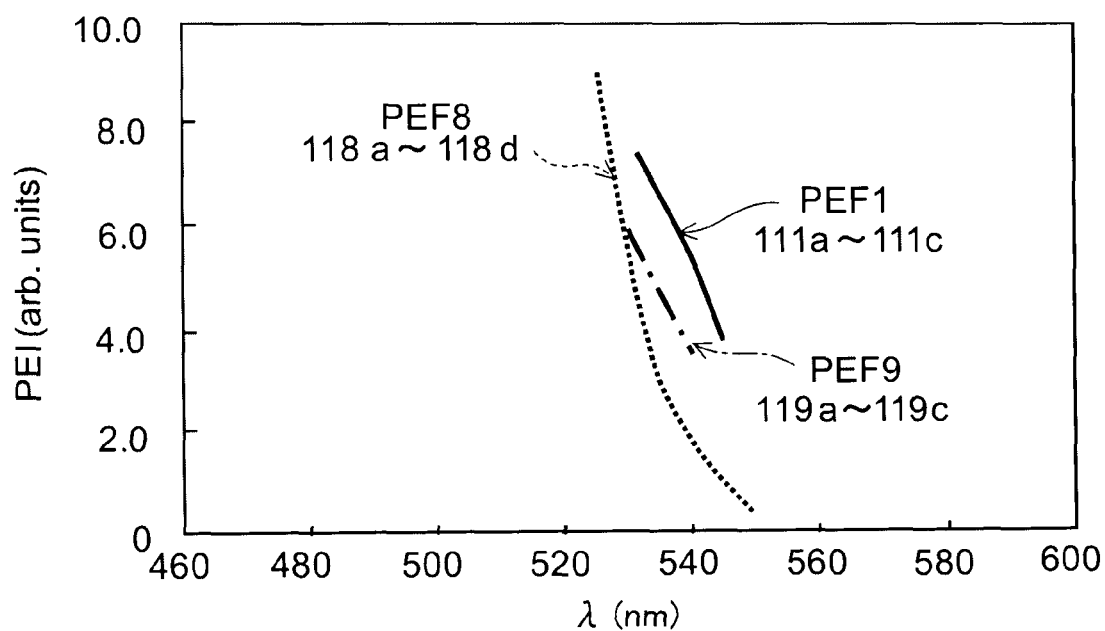
FIG. 8 is a graph showing the simulation results of the characteristics of the semiconductor light emitting devices.

FIG. 8 is a graph illustrating the simulation results of the characteristics of the semiconductor light emitting devices. This graph is prepared based on the results illustrated in FIGS. 7A to 7C. The horizontal axis represents a wavelength λ (nm). The vertical axis represents the light emission intensity EI (peak light emission intensity PEI) at the peak wavelength in the respective semiconductor light emitting devices described above. This view depicts the peak light emission intensity curves PEF1, PEF8, and PEF9.

As illustrated in FIG. 8, the peak light emission intensity curve PEF8 of the first reference example is at the lowest position in the view. The peak light emission intensity curve PEF9 of the second reference example is located above the peak light emission intensity curve PEF8. The peak light emission intensity curve PEF1 according to the embodiment is at the highest position in the view. That is, the peak light emission intensity PEI in the embodiment is the highest.

That is, in the semiconductor light emitting devices 118a-118d of the first reference example, the peak light emission intensity PEI steeply decreases as the peak wavelength increases. In the semiconductor light emitting devices 119a-119c of the second reference example, the peak light emission intensity PEI is higher than the first reference example. However, the extent of the improvement in the peak light emission intensity PEI is small.

In contrast, in the semiconductor light emitting devices 111a-111c according to the embodiment, the peak light emission intensity PEI is higher than the first reference example and is much higher than the second reference example.

By providing the n-side intermediate layer MN and the p-side intermediate layer MP in this manner, a high light emission intensity can be obtained. That is, according to the embodiment, a highly efficient semiconductor light emitting device is provided. The improvement of this light emission efficiency is high notably at the wavelength of 500 nm or more. More specifically, as illustrated in FIG. 8, for example, at the peak wavelength of light emission of 530 nm or more, the improvement effect of the light emission efficiency appears notably.

The inventor has investigated the cause why the light emission intensity EI decreases when the wavelength increases, in the first reference example. According to this investigation, when a voltage is applied, an adverse effect on the emission characteristic caused by piezoelectric field may increase. That is, the light emission intensity has decreased due to the quantum confinement Stark effect caused by a piezoelectric field. The extent of this phenomenon increases significantly as the wavelength becomes longer. For this reason, in the light emission at a long wavelength (of green, yellow, red, or the like) of 500 nm or more, for example, the light emission efficiency exponentially decreases.

The inventor has studied the influence of the quantum confinement Stark effect on a quantum well potential distribution in the state where a voltage is applied. As a result, the inventor has found a special configuration providing a high light emission efficiency. The improvement in the light emission efficiency due to this configuration exhibits very significantly, notably at long wavelengths of 500 nm or more.

That is, the In composition ratio among the group III elements in the first well layer WL1 is 0.18 or more. Then, the peak wavelength of the light emitted from the light emitting part 40 is 500 nm or more. Then, the improvement effect of the light emission efficiency increases.

FIGS. 9A to 9C are schematic views illustrating the simulation results of the characteristics of the semiconductor light emitting devices.

These views illustrate bandgap energy characteristics (valence band VB and conduction band CB) in the light emitting layer EL and wave functions (an electron wave function WFE and a hole wave function WFH). FIG. 9A corresponds to the semiconductor light emitting devices 111 (111a-111c) and 110 according to the embodiment. FIG. 9B corresponds to the semiconductor light emitting device 118 (118a-118d) of the first reference example. FIG. 9C corresponds to the semiconductor light emitting device 119 (119a-119c) of the second reference example. In these views, a portion related to one well layer WL is illustrated, but this is also true when a plurality of well layers WL is provided.

As illustrated in FIG. 9B, in the first reference example, when a voltage is applied, in the quantum well, the electron wave function WFE and the hole wave function WFH are spatially separated from each other. That is, the integral value of the overlap integral between the electron wave function WFE and the hole wave function WFH is small. For this reason, the light emission recombination probability is low. As a result, it is difficult to obtain highly efficient light emission. This phenomenon becomes particularly remarkable at long wavelengths of 500 nm or more, for example.

As illustrated in FIG. 9C, in the second reference example, the distance from the electron wave function WFE to the hole wave function WFH becomes closer than that in the first reference example. Thus, as illustrated in FIG. 8, in the second reference example, the peak light emission intensity PEI higher than the first reference example may be obtained. However, as illustrated in FIG. 9C, the overlap integral between the electron wave function WFE and the hole wave function WFH in the second reference example is not sufficiently large.

In contrast, as illustrated in FIG. 9A, in the semiconductor light emitting device according to the embodiment, the electron wave function WFE and the hole wave function WFH are adjacent to each other. That is, the integral value of the overlap between the electron wave function WFE and the hole wave function WFH is large. For this reason, as illustrated in FIG. 8, in the embodiment, a very high peak light emission intensity PEI may have been obtained.

This characteristic can be obtained with the configuration in which the n-side intermediate layer MN and the p-side intermediate layer MP are provided between the well layer WL and the p-side barrier layer BL.

As illustrated in FIG. 9A, in the embodiment, the conduction band CB in the well layer WL decreases along the +Z direction, and the conduction band CB in the n-side intermediate layer MN rises along the +Z direction. Thus, in the embodiment, the symmetry of the conduction band CB along the +Z direction is high.

Furthermore, in the embodiment, the symmetry of the valence band VB along the +Z direction is also high. That is, an energy P1 at the boundary between the well layer WL and the n-side barrier layer BL (e.g., the n-side barrier layer BLN) is substantially the same as an energy P2 at the boundary between the n-side intermediate layer MN and the p-side intermediate layer MP. Then, a gradient Q1 of the energy in the n-side barrier layer BL (e.g., the n-side barrier layer BLN) is substantially the same as a gradient Q2 of the energy in the p-side intermediate layer MP (e.g., the first p-side intermediate layer MP1 or the like).

Thus, in the embodiment, in the state where a voltage is applied, the quantum well structure with a highly symmetric conduction band CB is provided by the n-side intermediate layer MN. Then, the quantum well structure with a highly symmetric valence band VB is provided by the p-side intermediate layer MP. Such a quantum well structure increases the spatial overlap between the electron wavefunction and the hole wavefunction. Thus, a highly efficient light emission can be obtained.

A configuration can be conceivable, wherein a layer whose In composition ratio CIn varies is provided between the light emitting part 40 and the p-type semiconductor layers 50. In this configuration, the carrier injection efficiency may be improved, for example. However, in this configuration, it is difficult to control the spatial overlap between the electron distribution and the hole distribution in the light emitting layer EL within the light emitting part 40. For this reason, it is difficult for this mechanism to improve the light emission efficiency.

In contrast, in the embodiment, the spatial overlap between the electron wavefunction and the hole wavefunction is controlled so as to suppress the quantum-confined Stark effect. This improves the light emission efficiency.

Various kinds of studies have revealed that in the configuration according to the embodiment, the average change rate along the +Z direction of the In composition ratio CIn in the first p-side intermediate layer MP1 is set lower than the average change rate along the +Z direction of the In composition ratio in the first n-side intermediate layer MN1 so as to be able to improve notably the symmetries of the conduction band CB and the valence band VB.

For example, when only one intermediate layer is provided between the i-th well layer WLi and the i-th barrier layer BLi and when the variation in the In composition ratio CIn therein is constant, the symmetries of the conduction band CB and the valence band VB are unlikely to be improved.

In contrast, as the intermediate layer, a portion having a high change rate of the In composition ratio CIn is provided in contact with the well layer WL (the i-th well layer WLi) and a portion having a low change rate of the In composition ratio CIn is provided in contact with the p-side barrier layer BL (the i-th barrier layer BLi), thereby increasing the effect of improvement in the symmetries of the conduction band CB and the valence band VB.

As illustrated in FIG. 9C, in the second reference example in which the In composition ratio CIn in the well layer WL is inclined, for example if the band-profile of the valence band VB in the well layer WL is set flat, the band-profile of the conduction band CB of the well layer WL is inclined significantly. Thus, in the second reference example, the symmetry of the quantum well structure is low. For this reason, the improvement in the light emission efficiency by the second reference example is limited.

The embodiment has a novel configuration wherein the n-side intermediate layer MN and the p-side intermediate layer MP are provided between the well layer WL and the p-side barrier layer BL. This improves the light emission efficiency. This configuration can be applied to the SQW structure having one well layer WL, and improve the light emission efficiency. This configuration can be applied to the MQW structure having a plurality of well layers WL. The MQW structure further increases the light emission efficiency because the above-described effect can be obtained in a plurality of well layers WL.

In the embodiment, the In composition ratio can be measured using a method, such as energy dispersive X-ray spectroscopy (EDX), for example. Secondary ion mass spectroscopy (SIMS) or a structural-analysis method by omega-2theta scan using an X-ray diffractometer can be also used.

Figure 10A:
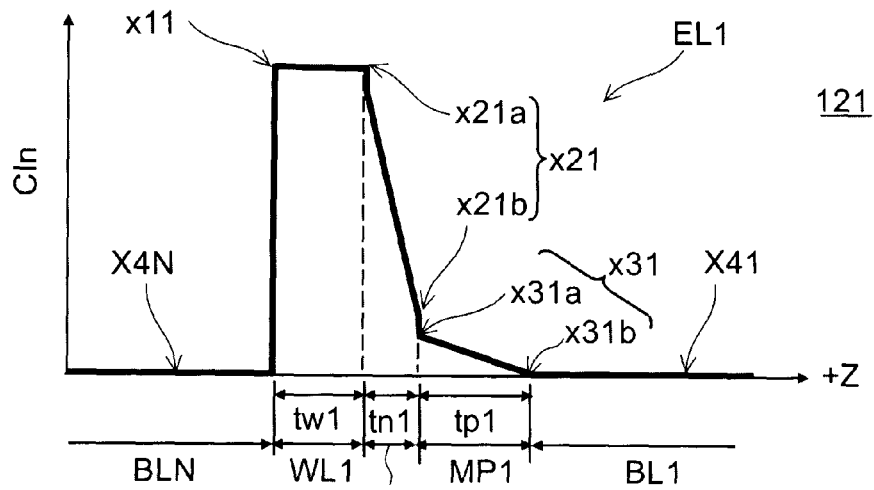
FIGS. 10A to 10C are schematic views showing a part of semiconductor light emitting devices according to the embodiment.
Figure 10B:
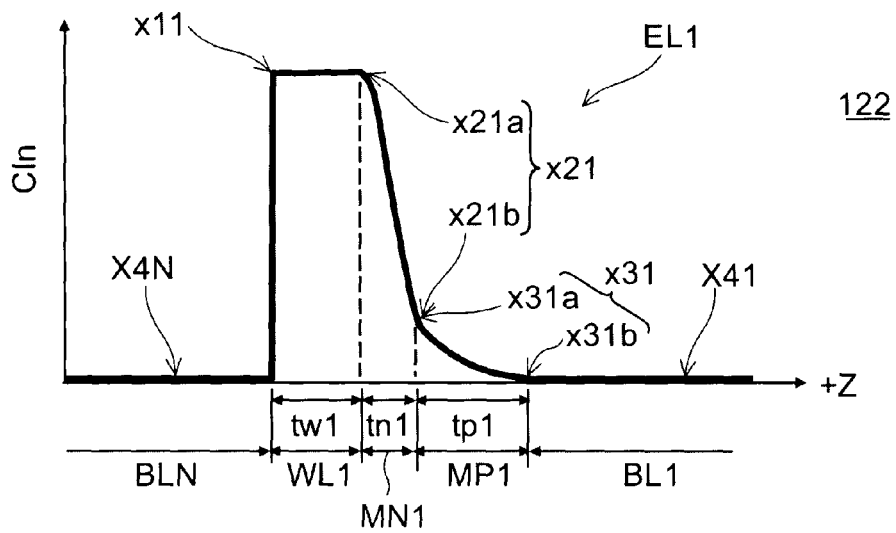
Figure 10C:
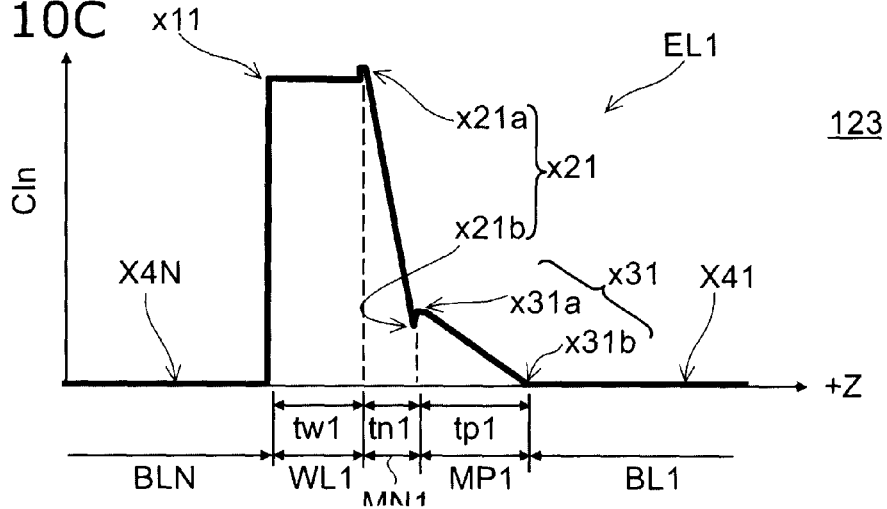

FIGS. 10A to 10C are schematic views illustrating the configuration of a part of semiconductor light emitting devices according to an embodiment.

These views illustrate the first light emitting layer EL1 as one light emitting layer EL. Hereinafter, although the first light emitting layer EL1 will be explained, the configuration of the first light emitting layer EL1 can be applied to any one of the light emitting layers EL.

As illustrated in FIG. 10A, in a semiconductor light emitting device 121 according to the embodiment, the In composition ratio x21a in the portion of the first n-side intermediate layer MN1 in contact with the first well layer WL1 is lower than the In composition ratio x11 among the group III elements contained in the first well layer. Then, the In composition ratio x31a in the portion of the first p-side intermediate layer MP1 in contact with the first n-side intermediate layer MN1 is lower than the In composition ratio x21b in the portion of the first n-side intermediate layer MN1 in contact with the first p-side intermediate layer MP1. In this manner, the In composition ratio CIn may stepwisely vary.

As described above, the In composition ratio x21a in the portion of the first n-side intermediate layer MN1 in contact with the first well layer WL1 is equal to or less than the In composition ratio x11 among the group III elements contained in first well layer WL1, and the In composition ratio x31a in the portion of the first p-side intermediate layer MP1 in contact with the first n-side intermediate layer MN1 is equal to or less than the In composition ratio x21b in the portion of the first n-side intermediate layer MN1 in contact with the first p-side intermediate layer MR Thus, the In composition ratio CIn decreases monotonously. As a result, the symmetries of the conduction band CB and the valence band VB can be easily improved.

The In composition ratio x31b in the portion of the first p-side intermediate layer MN1 in contact with the first barrier layer BL1 is equal to or greater than the In composition ratio x41 among the group III elements in the first barrier layer BL1. Thus, the In composition ratio CIn decreases monotonously. As a result, the symmetries of the conduction band CB and the valence band VB can be easily improved.

As illustrated in FIG. 10B, in a semiconductor light emitting device 122 according to the embodiment, the In composition ratio CIn curvedly varies. Also in this case, the light emission efficiency can be improved. When the In composition ratio CIn curvedly varies, for example a portion in which the extent of the change in the In composition ratio CIn varies can be regarded as the boundary between the n-side intermediate layer MN and the p-side intermediate layer MP.

In the embodiment, not only the average change rate of the In composition ratio CIn in two intermediate layers but also the change rate of the In composition ratio CIn in the center of two intermediate layers may be controlled.

For example, the change rate along the +Z direction of the In composition ratio CIn in the center portion along the +Z direction of the first p-side intermediate layer MP1 can be set lower than the change rate along the +Z direction of the In composition ratio CIn in the center portion along the +Z direction of the first n-side intermediate layer MN1. As a result, the symmetries of the conduction band CB and the valence band VB can be improved.

As illustrated in FIG. 10C, in the semiconductor light emitting device 123 according to the embodiment, the In composition ratio x21a in the portion of the first n-side intermediate layer MN1 in contact with the first well layer WL1 is higher than the In composition ratio x11 among the group III elements contained in the first well layer. However, the difference between x21a and x11 is small. In the first n-side intermediate layer MN1, the thickness of a portion whose In composition ratio CIn is higher than x11 is thin. Then, the In composition ratio x31a in the portion of the first p-side intermediate layer MP1 in contact with the first n-side intermediate layer MN1 is higher than the In composition ratio x21b in the portion of the first n-side intermediate layer MN1 in contact with the first p-side intermediate layer MP1. However, the difference between x31a and x21b is small. In the first p-side intermediate layer MP1, the thickness of a portion whose In composition ratio CIn is higher than x21b is thin.

In the i-th n-side intermediate layer MNi and the i-th p-side intermediate layer MPi, also when a portion whose In composition ratio CIn is locally high and a portion whose In composition ratio CIn is locally low are provided, if these portions are sufficiently small relative to the entire intermediate layers, these portions can be substantially ignored. In this case, the whole In composition ratio CIn can be regarded as decreasing from the first well layer WL1 toward the first barrier layer BL1. Then, also in this case, the change rate in the first p-side intermediate layer MP1 is lower than the change rate in the first n-side intermediate layer MN1. Also in such a configuration, the symmetries of the conduction band CB and the valence band VB can be improved and the light emission efficiency can be improved.

Figure 11A:
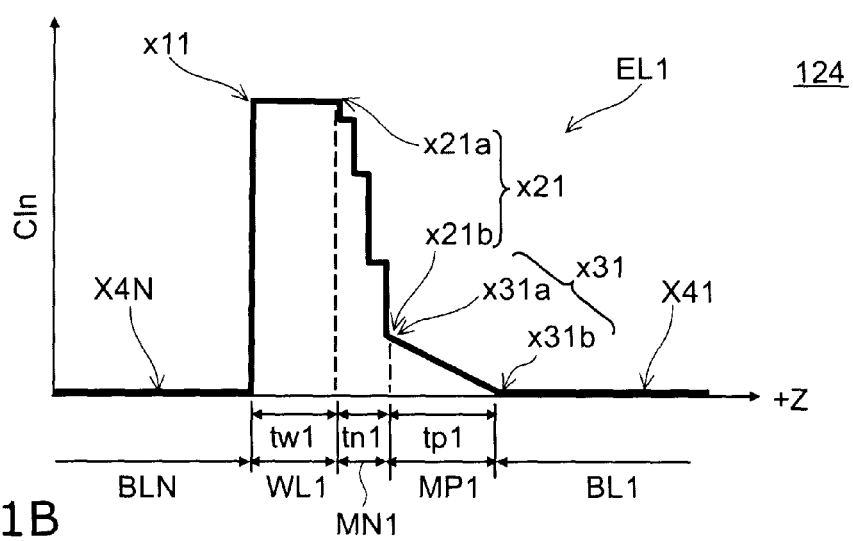
FIGS. 11A and 11B are schematic views showing a part of semiconductor light emitting devices according to the embodiment.
Figure 11B:
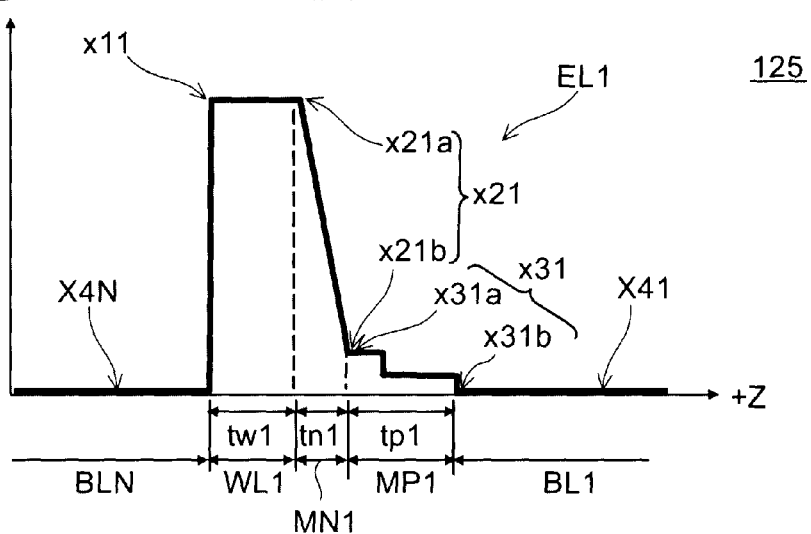

FIGS. 11A and 11B are schematic views illustrating the configuration of a part of semiconductor light emitting devices according to an embodiment.

These views illustrate the first light emitting layer EL1 as one light emitting layer EL. Hereinafter, although the first light emitting layer EL1 will be explained, the configuration of the first light emitting layer EL1 can be applied to any one of the light emitting layers EL.

As illustrated in FIG. 11A, in a semiconductor light emitting device 124 according to the embodiment, the In composition ratio CIn in the first n-side intermediate layer MN1 varies stepwisely. Also in this case, the In composition ratio CIn in the first n-side intermediate layer MN1 decreases along the +Z direction.

As illustrated in FIG. 11B, in a semiconductor light emitting device 125 according to the embodiment, the In composition ratio CIn in the first p-side intermediate layer MP1 varies stepwisely. Also in this case, the In composition ratio CIn in the first p-side intermediate layer MP1 decrease along the +Z direction.

Also in the semiconductor light emitting devices 124 and 125, a highly efficient semiconductor light emitting device can be obtained.

As illustrated in FIG. 1B, assume that a plurality of light emitting layers EL is provided and that the second light emitting layer EL2 is provided between the first light emitting layer EL1 and the p-type semiconductor layer 50. Then, the first barrier layer BL1 is preferably in contact with the second well layer WL2. That is, for example, between the first barrier layer BL1 and the second well layer WL2, the intermediate layer is not provided. Thus, the symmetries of the conduction band CB and the valence band VB can be easily improved.

For example, the first well layer WL1 is preferably in contact with the n-side barrier layer BLN.

For example, when the (i+1)th light emitting layer EL(i+1) is provided between the i-th light emitting layer ELi and the p-type semiconductor layer 50, the i-th barrier layer BLi is preferably in contact with the (i+1)th well layer WL (i+1).

The In composition ratio x21b in the portion of the first n-side intermediate layer MN1 in contact with the first p-side intermediate layer MP1 is preferable set to ¼ or less of the In composition ratio x11 among the group III elements in the first well layer WL1. For example, when the In composition ratio x11 among the group III elements in the first well layer WL1 is 0.18 or more, the In composition ratio x21b in the portion of the first n-side intermediate layer MN1 in contact with the first p-side intermediate layer MP1 can be set to 0.045 or more. Furthermore, at this time, the In composition ratio x21b can be set to 0.03 or less.

Thus, the average change rate along the +Z direction of the In composition ratio CIn in the first n-side intermediate layer MN1 can be set sufficiently high. Thus, the average change rate along the +Z direction of the In composition ratio CIn in the first p-side intermediate layer MP1 can be easily set lower than the average change rate along the +Z direction of the In composition ratio CIn in the first n-side intermediate layer MN1. Accordingly, the light emission efficiency can be stably improved.

The thickness (the first p-side intermediate layer thickness tp1) of the first p-side intermediate layer MP1 is preferably equal to or greater than the thickness (the first n-side intermediate layer thickness tn1) of the first n-side intermediate layer MN1. The thickness (the first p-side intermediate layer thickness tp1) of the first p-side intermediate layer MP1 is preferably equal to or greater than the thickness (the first well layer thickness tw1) of the first well layer WL1. Thus, the average change rate along the +Z direction of the In composition ratio CIn in the first p-side intermediate layer MP1 can be easily set lower than the average change rate along the +Z direction of the In composition ratio CIn in the first n-side intermediate layer MN1.

On the other hand, the thickness (the first n-side intermediate layer thickness tn1) of the first n-side intermediate layer MN1 can be set equivalent to the thickness (the first well layer thickness tw1) of the first well layer WL1. More specifically, the first n-side intermediate layer thickness tn1 can be set within a range from a half of the first well layer thickness tw1 to twice thereof. Thus, the average change rate along the +Z direction of the In composition ratio CIn in the first p-side intermediate layer MP1 can be easily set lower than the average change rate along the +Z direction of the In composition ratio CIn in the first n-side intermediate layer MN1.

The thickness of the first well layer WL1 (the i-th well layer WLi) can be set within a range from 1 nm to 5 nm, for example. More preferably, the thickness of the first well layer WL1 (the i-th well layer WLi) is in a range from 1 nm to 3.5 nm. If the thickness of the i-th well layer WLi is thinner than 1 nm, it is difficult to obtain the light emission of a long wavelength of 500 nm or more. If the thickness of the i-th well layer WLi is thicker than 5 nm, the crystal quality is likely to degrade. Furthermore, if the thickness of the i-th well layer WLi is thicker than 5 nm, the spatial separation between the electron wavefunction and the hole wavefunction will increase and the light emission intensity tends to be weakened.

The thickness of the first n-side intermediate layer MN1 (the i-th n-side intermediate layer MNi) can be set within a range from 1 nm to 5 nm, for example.

On the other hand, the thickness of the first p-side intermediate layer MP1 (the i-th p-side intermediate layer MPi) can be set within a range from 3 nm and 8 nm, for example.

For example, the first barrier layer BL1 (the i-th barrier layer BLi) substantially does not contain a p-type impurity. For example, the concentration in the p-type impurity in the first barrier layer BL1 (the i-th barrier layer BLi) is lower than the concentration in the p-type impurity contained in the p-type semiconductor layer 50.

In the embodiment, the first well layer WL1 (the i-th well layer WLi) can include a portion in which the In composition ratio among group III elements is constant along the +Z direction. By combining such a well layer WL, an n-side intermediate layer MN, and a p-side intermediate layer MP, the symmetries of the conduction band CB and the valence band VB can be improved easily.

Hereinafter, an example of the method of manufacturing the semiconductor light emitting device according to the embodiment will be explained.

First, a substrate 10 is thermally cleaned at the susceptor temperature of 1100° C., for example.

Next, the susceptor temperature is decreased to 500° C., and a buffer layer 11 is formed on the substrate 10. For the buffer layer 11, a GaN layer is used, for example.

Next, the susceptor temperature is increased to 1120° C., and a foundation layer 21 is formed. For the foundation layer 21, an undoped GaN layer is used, for example. Subsequently, an n-side contact layer 22 is formed. For the n-side contact layer, a Si-doped GaN layer is used, for example.

The carrier gas is changed from $H_2$ gas to $N_2$ gas, and the susceptor temperature is decreased to 810° C., and a multilayer stacked body 23 is formed. For the thin film layer SB, an $In_{0.08}Ga_{0.92}N$ layer is used, for example. The thickness of the thin film layer SB is set to 1 nm, for example. For the thick film layer SA, a GaN layer is used, for example. The thickness of the thick film layer SA is set to 3 nm, for example. These thin film layers SB and thick film layers SA are formed alternately. The number of thick film layers SA is set to 20, for example, and the number of the thin film layers SB is set to 21, for example. The In composition ratio CIn in the thin film layer SB is preferably lower than that of the In composition ratio CIn in the well layer WL.

Subsequently, the n-side barrier layer BLN is formed. The thickness of the n-side barrier layer BLN is preferably in a range from 3 nm to 20 nm, for example. The susceptor temperature in forming the n-side barrier layer BLN is preferably equal to or greater than the susceptor temperature used in growing the multilayer stacked body 23. For example, the susceptor temperature can be set to 950° C. If the thickness of the n-side barrier layer BLN is thick, an excellent flatness can be achieved. However, when the thickness of the n-side barrier layer BLN is larger than 20 nm, the influence of the multilayer stacked body 23 on the light emitting layer EL becomes smaller. If the thickness of the n-side barrier layer BLN is thinner than 3 nm, the surface flatness is not sufficient. In forming the n-side barrier layer BLN, if the susceptor temperature is 1000° C. or less, it is preferable to use $N_2$ gas as the carrier gas. However, for the carrier gas, a mixed gas of $N_2$ and $H_2$ gases may be used. At this time, the flow rate of $H_2$ gas is preferably equal to or less than a half of the total flow rate of the mixed gas.

Subsequently, the susceptor temperature is decreased to a range from 700° C. to 800° C. Then, the well layer WL is formed. Subsequently, the n-side intermediate layer MN is formed. The formation of the n-side intermediate layer MN is performed continuously with the formation of the well layer WL, for example. In the formation of the n-side intermediate layer MN, the flow rate of an In element material gas is reduced with time. Furthermore, the p-side intermediate layer MP is formed. In the formation of the well layer WL, the n-side intermediate layer MN, and the p-side intermediate layer MP, the flow rate of the In element material gas is automatically controlled, for example. Thus, the change rate of the In composition ratio CIn and the thickness of each layer can be controlled appropriately. In the formation of the n-side intermediate layer MN and the p-side intermediate layer MP, the susceptor temperature or the pressure may be changed so as to change the incorporation of the In element into the crystal surface. For example, in the formation of the p-side intermediate layer MP, the susceptor temperature is raised to the growth temperature of the barrier layer BL while keeping the flow rate of the In element material gas constant. The higher the susceptor temperature, the further the incorporation of the In element into the crystal surface is reduced. Therefore, a p-side intermediate layer MP having an inclined composition which increases the susceptor temperature is formed.

Subsequently, the barrier layer BL is formed. For the barrier layer BL, a GaN layer is used, for example. The formation temperature of the barrier layer BL is preferably equal to or greater than the formation temperature of the well layer WL. At this time, the difference between the formation temperature of the barrier layer BL and the formation temperature of the well layer WL is set to 200° C. or less. When the formation temperature of the barrier layer BL is the same as the formation temperature of the well layer WL, a pit is likely to occur in the barrier layer BL. For this reason, the formation temperature of the barrier layer BL is preferably higher than the formation temperature of the well layer WL. If the difference between the formation temperature of the barrier layer BL and the formation temperature of the well layer WL is greater than 200° C., the well layer WL may degrade.

The intermediate layer can be formed by interrupting the crystal growth when the temperature is increased to make a part of In in the well layer to diffuse.

The above-described formation of the well layer WL, the n-side intermediate layer MN, the p-side intermediate layer MP, and the barrier layer BL is repeated. Thus, the light emitting part 40 is formed.

The third p-type layer 53, the second p-type layer 52, and the first p-type layer 51 are sequentially formed on the light emitting part 40. Thus, the p-type semiconductor layer 50 is formed and the stacked structure body 10s is formed.

Subsequently, the stacked structure body 10s is processed to form the n-side electrode 70 and the p-side electrode 80. As a result, the semiconductor light emitting device according to the embodiment is obtained.

For the method of growing each semiconductor layer in the semiconductor light emitting device according to the embodiment, for example, Metal-Organic Chemical Vapor Deposition (MOCVD), Metal-Organic Vapor Phase Epitaxy (MOVPE), and the like can be used.

For the raw material in the formation of each semiconductor layer, the following ones can be used. For example, TMGa (trimethylgallium), TEGa (triethylgallium), and the like can be used as the raw material of Ga. For example, TMIn (trimethylindium), TEIn (triethylindium), and the like can be used as the raw material of In. For example, TMAl (trimethylaluminum) or the like can be used as the raw material of Al. For example, $NH_3$ (ammonia), MMHy (monomethylhydrazine), DMHy (dimethylhydrazine), and the like can be used as the raw material of N. For example, $SiH_4$ (monosilane) and the like can be used as the raw material of Si. For example, $Cp_2Mg$ (biscyclopentadienyl magnesium) and the like can be used as the raw material of Mg.

According to the embodiment, a highly efficient semiconductor light emitting device can be provided.

In the specification, "nitride semiconductor" includes all compositions of semiconductors of the chemical formula $B_xIn_yAl_zGa_{1-x-y-z}N$ ($0 \le x \le 1$, $0 \le y \le 1$, $0 \le z \le 1$, and $x+y+z \le 1$) for which each of the compositional proportions x, y, and z are changed within the ranges. "Nitride semiconductor" further includes group V elements other than N (nitrogen) in the chemical formula recited above, various elements added to control various properties such as the conductivity type, etc., and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in semiconductor light emitting devices such as n-type semiconductor layers, p-type semiconductor layers, light emitting parts, light emitting layers, well layers, barrier layers, intermediate layers, electrodes etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor light emitting devices practicable by an appropriate design modification by one skilled in the art based on the semiconductor light emitting devices described above as embodiments of the invention also are within the scope of the invention to the extent that the purport of the embodiments of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
   an n-type semiconductor layer;
   a p-type semiconductor layer; and
   a light emitting part provided between the n-type semiconductor layer and the p-type semiconductor layer and including a first light emitting layer,
   the first light emitting layer including:
      a first barrier layer including a nitride semiconductor;
      a first well layer provided between the n-type semiconductor layer and the first barrier layer and including a nitride semiconductor;
      a first n-side intermediate layer provided between the first well layer and the first barrier layer and including a nitride semiconductor; and a first p-side intermediate layer provided between the first n-side intermediate layer and the first barrier layer and including a nitride semiconductor;

an In composition ratio among group III elements in the first n-side intermediate layer decreasing along a first direction from the n-type semiconductor layer toward the p-type semiconductor layer, an In composition ratio among group III elements in the first p-side intermediate layer decreasing along the first direction, an average change rate along the first direction of the In composition ratio in the first p-side intermediate layer being lower than an average change rate along the first direction of the In composition ratio in the first n-side intermediate layer, and wherein a thickness of the first p-side intermediate layer is equal to or more than a thickness of the first n-side intermediate layer, and equal to or more than a thickness of the first well layer.

2. The device according to claim 1, wherein
the light emitting part further includes a second light emitting layer stacked with the first light emitting layer along the first direction, wherein
the second light emitting layer includes:
   a second barrier layer including a nitride semiconductor;
   a second well layer provided between the n-type semiconductor layer and the second barrier layer and including a nitride semiconductor;
   a second n-side intermediate layer provided between the second well layer and the second barrier layer and including a nitride semiconductor; and
   a second p-side intermediate layer provided between the second n-side intermediate layer and the second barrier layer and including a nitride semiconductor,
wherein
an In composition ratio among group III elements in the second n-side intermediate layer decreases along a first direction from the n-type semiconductor layer toward the p-type semiconductor layer, wherein
an In composition ratio among group III elements in the second p-side intermediate layer decreases along the first direction, and
an average change rate along the first direction of the In composition ratio in the second p-side intermediate layer is lower than an average change rate along the first direction of the In composition ratio in the second n-side intermediate layer.

3. The device according to claim 2, wherein the second light emitting layer is provided between the first light emitting layer and the p-type semiconductor layer, and the first barrier layer is in contact with the second well layer.

4. The device according to claim 1, wherein
the first well layer contains In,
the In composition ratio in a portion of the first n-side intermediate layer in contact with the first well layer is equal to or less than an In composition ratio among group III elements contained in the first well layer, and
the In composition ratio in a portion of the first p-side intermediate layer in contact with the first n-side intermediate layer is equal to or less than the In composition ratio in a portion of the first n-side intermediate layer in contact with the first p-side intermediate layer.

5. The device according to claim 1, wherein an In composition ratio among group III elements in the first well layer is 0.18 or more.

6. The device according to claim 1, wherein the In composition ratio in a portion of the first n-side intermediate layer in contact with the first p-side intermediate layer is ¼ or less of an In composition ratio among group III elements in the first well layer.

7. The device according to claim 1, wherein
a thickness of the first n-side intermediate layer is ½ or more and two times or less of a thickness of the first well layer.

8. The device according to claim 1, wherein the first barrier layer includes GaN.

9. The device according to claim 1, wherein the first well layer has a portion in which the In composition ratio among group III elements is constant along the first direction.

10. The device according to claim 1, wherein a peak wavelength of light emitted from the light emitting part is 500 nanometers or more.

11. The device according to claim 1, wherein
the first barrier layer contains In,
the In composition ratio in a portion of the first p-side intermediate layer in contact with the first barrier layer is equal to or more than an In composition ratio among group III elements in the first barrier layer.

12. The device according to claim 1, wherein the In composition ratio in a portion of the first n-side intermediate layer in contact with the first p-side intermediate layer is 0.03 or less.

13. The device according to claim 1, wherein the first light emitting layer further includes an n-side barrier layer provided between the n-type semiconductor layer and the first well layer and the n-side barrier layer is in contract with the first well layer.

14. The device according to claim 1, wherein a thickness of the first well layer is 1 nanometer or more and less than 3.5 nanometers.

15. A semiconductor light emitting device, comprising:
an n-type semiconductor layer;
a p-type semiconductor layer; and
a light emitting part provided between the n-type semiconductor layer and the p-type semiconductor layer and including a first light emitting layer,
the first light emitting layer including:
   a first barrier layer including a nitride semiconductor containing p-type impurity;
   a first well layer provided between the n-type semiconductor layer and the first barrier layer and including a nitride semiconductor;
   a first n-side intermediate layer provided between the first well layer and the first barrier layer and including a nitride semiconductor; and
   a first p-side intermediate layer provided between the first n-side intermediate layer and the first barrier layer and including a nitride semiconductor;
an In composition ratio among group III elements in the first n-side intermediate layer decreasing along a first direction from the n-type semiconductor layer toward the p-type semiconductor layer,
an In composition ratio among group III elements in the first p-side intermediate layer decreasing along the first direction,
an average change rate along the first direction of the In composition ratio in the first p-side intermediate layer being lower than an average change rate along the first direction of the In composition ratio in the first n-side intermediate layer, and wherein a concentration of the p-type impurity contained in the first barrier layer is lower than a concentration of a p-type impurity contained in the p-type semiconductor layer.

16. A semiconductor light emitting device, comprising:
an n-type semiconductor layer;
a p-type semiconductor layer; and
a light emitting part provided between the n-type semiconductor layer and the p-type semiconductor layer and including a first light emitting layer,
the first light emitting layer including:
  a first barrier layer including a nitride semiconductor;
  a first well layer provided between the n-type semiconductor layer and the first barrier layer and including a nitride semiconductor;
  a first n-side intermediate layer provided between the first well layer and the first barrier layer and including a nitride semiconductor; and
  a first p-side intermediate layer provided between the first n-side intermediate layer and the first barrier layer and including a nitride semiconductor;
an In composition ratio among group III elements in the first n-side intermediate layer decreasing along a first direction from the n-type semiconductor layer toward the p-type semiconductor layer,
an In composition ratio among group III elements in the first p-side intermediate layer decreasing along the first direction,
an average change rate along the first direction of the In composition ratio in the first p-side intermediate layer being lower than an average change rate along the first direction of the In composition ratio in the first n-side intermediate layer, and
wherein a thickness of the first n-side intermediate layer is 1 nanometer or more and less than 5 nanometers.

17. A semiconductor light emitting device, comprising:
an n-type semiconductor layer;
a p-type semiconductor layer; and
a light emitting part provided between the n-type semiconductor layer and the p-type semiconductor layer and including a first light emitting layer,
the first light emitting layer including:
  a first barrier layer including a nitride semiconductor;
  a first well layer provided between the n-type semiconductor layer and the first barrier layer and including a nitride semiconductor;
  a first n-side intermediate layer provided between the first well layer and the first barrier layer and including a nitride semiconductor; and
  a first p-side intermediate layer provided between the first n-side intermediate layer and the first barrier layer and including a nitride semiconductor;
an In composition ratio among group III elements in the first n-side intermediate layer decreasing along a first direction from the n-type semiconductor layer toward the p-type semiconductor layer,
an In composition ratio among group III elements in the first p-side intermediate layer decreasing along the first direction,
an average change rate along the first direction of the In composition ratio in the first-side intermediate layer being lower than an average change rate along the first direction of the In composition ratio in the first n-side intermediate layer, and
wherein a thickness of the first p-side intermediate layer is 3 nanometers or more and less than 8 nanometers.

18. A semiconductor light emitting device, comprising:
an n-type semiconductor layer;
a p-type semiconductor layer; and
a light emitting part provided between the n-type semiconductor layer and the p-type semiconductor layer and including a first light emitting layer,
the first light emitting layer including:
  a first barrier layer including a nitride semiconductor;
  a first well layer provided between the n-type semiconductor layer and the first barrier layer and including a nitride semiconductor;
  a first n-side intermediate layer provided between the first well layer and the first barrier layer and including a nitride semiconductor; and
  a first p-side intermediate layer provided between the first n-side intermediate layer and the first barrier layer and including a nitride semiconductor;
an In composition ratio among group III elements in the first n-side intermediate layer decreasing along a first direction from the n-type semiconductor layer toward the p-type semiconductor layer,
an In composition ratio among group III elements in the first p-side intermediate layer decreasing along the first direction,
an average change rate along the first direction of the In composition ratio in the first p-side intermediate layer being lower than an average change rate along the first direction of the In composition ratio in the first n-side intermediate layer, and
wherein a change rate along the first direction of the In composition ratio in a center portion along the first direction of the first p-side intermediate layer is lower than a change rate along the first direction of the In composition ratio in a center portion along the first direction of the first n-side intermediate layer.

19. A semiconductor light emitting device, comprising:
an n-type semiconductor layer;
a p-type semiconductor layer; and
a light emitting part provided between the n-type semiconductor layer and the p-type semiconductor layer and including a first light emitting layer,
the first light emitting layer including:
  a first barrier layer including a nitride semiconductor;
  a first well layer provided between the n-type semiconductor layer and the first barrier layer and including a nitride semiconductor;
  a first n-side intermediate layer provided between the first well layer and the first barrier layer and including a nitride semiconductor; and
  a first p-side intermediate layer provided between the first n-side intermediate layer and the first barrier layer and including a nitride semiconductor;
an In composition ratio among group III elements in the first n-side intermediate layer decreasing along a first direction from the n-type semiconductor layer toward the p-type semiconductor layer,
an In composition ratio among group III elements in the first p-side intermediate layer decreasing along the first direction,
an average change rate along the first direction of the In composition ratio in the first p-side intermediate layer being lower than an average change rate along the first direction of the In composition ratio in the first n-side intermediate layer, and
wherein a band gap energy of the first well layer is smaller than a band gap energy of the first barrier layer.

* * * * *